(12) United States Patent
Boone et al.

(10) Patent No.: US 7,179,329 B2
(45) Date of Patent: Feb. 20, 2007

(54) METHODS OF HYPERDOPING SEMICONDUCTOR MATERIALS AND HYPERDOPED SEMICONDUCTOR MATERIALS AND DEVICES

(75) Inventors: Thomas Boone, Hamden, CT (US); Eric S. Harmon, Norfolk, MA (US); Robert D. Koudelka, East Haven, CT (US); David B. Salzman, Chevy Chase, MD (US); Jerry M. Woodall, New Haven, CT (US)

(73) Assignee: Yale University, New Haven, CT (US)

( * ) Notice: Subject to any disclaimer, the term of this patent is extended or adjusted under 35 U.S.C. 154(b) by 152 days.

(21) Appl. No.: 10/277,352

(22) Filed: Oct. 22, 2002

(65) Prior Publication Data

US 2003/0121468 A1 Jul. 3, 2003

Related U.S. Application Data

(60) Provisional application No. 60/350,503, filed on Jan. 22, 2002, provisional application No. 60/341,051, filed on Oct. 22, 2001.

(51) Int. Cl.
*C30B 9/00* (2006.01)
(52) U.S. Cl. .......................................... 117/2
(58) Field of Classification Search ...................... 117/2
See application file for complete search history.

(56) References Cited

U.S. PATENT DOCUMENTS

| | | | | |
|---|---|---|---|---|
| 4,583,110 A | * | 4/1986 | Jackson et al. | 257/734 |
| 5,141,894 A | * | 8/1992 | Bisaro et al. | 438/479 |
| 5,329,257 A | * | 7/1994 | Ismail | 331/107 G |
| 5,371,399 A | | 12/1994 | Burroughes et al. | |
| 5,471,948 A | | 12/1995 | Burroughes et al. | |
| 5,508,829 A | | 4/1996 | Freeouf et al. | |
| 6,150,677 A | * | 11/2000 | Tanaka et al. | 257/201 |
| 6,806,507 B2 | * | 10/2004 | Ishida | 257/101 |
| 2003/0121468 A1 | * | 7/2003 | Boone et al. | 117/78 |
| 2004/0029368 A1 | * | 2/2004 | Harmon et al. | 438/510 |
| 2004/0178475 A1 | * | 9/2004 | Harmon et al. | 257/567 |

FOREIGN PATENT DOCUMENTS

WO WO 03/036697 A2 * 5/2003

OTHER PUBLICATIONS

Warren, Alan C. et al. 1.3um P-i-N Photodetector Using GaAs with As Precipitates (GaAs:As), IEEE Electron Device Letter, vol. 12, No. 10, Oct. 1991.
Nolte, D.D. et al. High-Density Optical Storage Based On Nanometer-size Arsenic Cluster In Low-Temperature-Growth GaAs. Appl. Phys. Lett. 61 (26), Dec. 28, 1992.
Melloch, M.R. et al. Arsenic Cluster Engineering For Excitonic Electro-Optics. J. Vac. Sci. Technol. B 11(3), May/Jun. 1993.
Carin, Lawrence et al. Characterization of Planar Antennas Fabricated on GaAs Epilayers Containing As Clusters for Picosecond Short-Pulse Applications. IEEE Microwave and Guided Wave Letters, vol. 3, No. 9, Sep. 1993.
Rahman, Arifur et al. Photoconductively Switched Antennas for Measuring Target Resonances. Appl. Phys. Lett. 64 (16), Apr. 18, 1994.
Cohen, E.B. et al. A 2Deg/Low-Temperature-Grown GaAs Dual Channel Heterostructure Transistor. Superlattices and Microstructures, vol. 17, No. 4, 1995.
Patkar, M.P. et al. Very Low Resistance Nanalloyed Ohmic Contacts Using Low-Temperature Molecular Beam Epitaxy of GaAs. Appl. Phys. Lett. 66 (11), Mar. 13, 1995.
Patkar, M.P. et al. Non-Alloyed Contacts to GaAs Using Non-Stoichiometric GaAs. Inst. Phys. Conf. Ser. No. 141: Chapter 6.
Woodall, J.M. et al. Better Ohmic Contacts and More Device Functionality Through Heavy Doping.
Lahiri, I. et al. Ultrafast-lifetime quantum wells with sharp exciton spectra. Appl. Phys. Lett. 66 (19), May 8, 1995.
Chen, E.H. et al. Use of Annealed Low-Temperature Grown GaAs as a Selective Phototech-Stop Layer. App. Phys. Lett. 68 (12), Mar. 18, 1996.
Tagare, M.V. et al. Nonalloyed ohmic Contacts To Heavily Be-Doped GaP and Inx Ga1-xP. Appl. Phys. Lett. 68 (24), Jun. 10, 1996.
Lahiri, I. et al. The Role of Excess Arsenic in Interface Mixing in Low-Temperature-Grown AlAs/GaAs Superlattices. Appl. Phys. Lett. 67 (9), Aug. 28, 1995.

(Continued)

*Primary Examiner*—Joseph S. Del Sole
(74) *Attorney, Agent, or Firm*—Goodwin Procter LLP

(57) ABSTRACT

Methods are disclosed for producing highly doped semiconductor materials. Using the invention, one can achieve doping densities that exceed traditional, established carrier saturation limits without deleterious side effects. Additionally, highly doped semiconductor materials are disclosed, as well as improved electronic and optoelectronic devices/components using said materials. The innovative materials and processes enabled by the invention yield significant performance improvements and/or cost reductions for a wide variety of semiconductor-based microelectronic and optoelectronic devices/systems.

Materials are grown in an anion-rich environment, which, in the preferred embodiment, are produced by moderate substrate temperatures during growth in an oxygen-poor environment. The materials exhibit fewer non-radiative recombination centers at higher doping concentrations than prior art materials, and the highly doped state of matter can exhibit a minority carrier lifetime dominated by radiative recombination at higher doping levels and higher majority carrier concentrations than achieved in prior art materials. Important applications enabled by these novel materials include high performance electronic or optoelectronic devices, which can be smaller and faster, yet still capture or emit light efficiently, and high performance electronics, such as transistors, which can be smaller and faster, yet cooler.

4 Claims, 13 Drawing Sheets

OTHER PUBLICATIONS

Chang, J.C.P. et al. Investigation of Interface Intermixing and Roughening in Low-Temperature-Grown AlAs/GaAs Multiple Quantum Wells During Thermal Annealing by Chemical Lattice Imaging and X-Ray Diffraction. Appl. Phys. Lett. 67.

Ahmed, S. et al. Low-Temperature Grown GaAs Tunnel Junctions. Electronic Letters, Aug. 28, 1997, vol. 33 No. 18.

Rizk, T. et al. Ballistic Transport and Andreev Resonances in Nb-in Superconducting Contacts to InAs and LTG-GaAs. Superlattices and Microstructures. vol. 25, 757, 1999.

Chen, C.H. et al. Bandwidth GaAs Light-Emitting Diodes. Appl. Phys. Lett. 74 (21), May 24, 1999.

Lee, T. et al. Ohmic Nanocontacts to GaAs Using undoped and p-doped layers of low-temperature-grown GaAs. Appl. Phys. Lett. 76 (2), Jan. 10, 2000.

Liu, J. et al. Guided self-assembly of Au nanocluster arrays electronically coupled to semiconductor device layers. Appl. Phys. Lett. 77(3), Jul. 17, 2000.

Janes, D.B. et al. Interface and contact structers for nanoelectronic devices using assemblies of metallic nanoclusters, conjugated organic molecules and chemically stable semiconductor layers. Superlattices and Microstructures, vol. 27, No. 5/6, 2000.

Akbulut, M. et al. Digital Communications Above 1 Gb/s Using 890-nm Surface-Emitting Light-Emitting Diodes. IEEE Photonics Technology Letters, vol. 13, No. 1 Jan. 2001.

Zhu, R. et al. Metal-Mirror-Based Resonant-Cavity Enhanced Light-Emiting Diodes by the Use of a Tunnel Diode Contact. IEEE Photonics Technology Letters vol. 13, No. 2, Feb. 2001.

Chen, Nien-Po et al. A Quantitative Conduction Model For A Low-Resistance Nonalloyed Ohmic Contact Structure Utilizing Low-Temperature-Grown GaAs. Journal of Applied Physics, vol. 88, No. 1, Jul. 1, 2000.

Melloch, M.R. et al. Formation of Arsenic Precipitates in GaAs Buffer Layers Grown By Molecular Beam Epitaxy At Low Substrate Temperatures. Appl. Phys. Lett. 57 (15), Oct. 8, 1990.

Warren, A.C. et al. Subpicosecond, Freely Propagating Electromagnetic Pulse Generation And Detection Using GaAs;As Epilayers. Appl. Phys. Lett. 58 (14), Apr. 8, 1991.

Mahalingam, K. et al. Substrate Temperature Dependence of Arsenic Precipitate Formation in AlGaAs and GaAs. J. Vac. Sci. Technol. B 9(4), Jul./Aug. 1991.

Melloch, M.R. et al. GaAs Buffer Layers Grown at Low Substrate Temperatures Using As2 and the Formation of Arsenic Precipitates. Journal of Crystal Growth 111 (1991) 39-42 North-Holland.

McInturff, D.T. et al. Photoemission Spectroscopy of GaAs:As photodiodes. Appl. Phys. Lett. 60 (4), Jan. 27, 1992.

McInturff, D.T. et al. Photoemission Spectroscopy of Al0.27Ga0.73As:As Photodiodes. Appl. Phys. Lett. 62 (19), May 10, 1993.

Mahalingam, K. et al. Arsenic Precipitate Accumulation and Depletion Zones at AlGaAs/GaAs Heterojunctions Grown at Low Substrate Temperature by Molecular Beam Epitaxy. J. Vac. Sci. Technol. B 10(2), Mar./Apr. 1992.

Matyi, R.J. et al. High Resolution X-Ray Diffraction Analysis of Annealed Low-Temperature Gallium Arsenide. Appl. Phys. Lett. 60 (21), May 25, 1992.

Mahalingam, K. et al. Arsenic Precipitates in Al0.3Ga0.7As/GaAs Multiple Superlattice and Quantum Well Structures. Appl. Phys. Lett. 60 (26), Jun. 29, 1992.

Melloch, M.R. et al. Formation of Two-Dimensional Arsenic-Precipitate Arrays in GaAs. Appl. Phys. Lett. 61 (2), Jul. 13, 1992.

Warren, A.C. et al. Role of Excess As in Low-Temperature-Grown GaAs. Physical Review B, vol. 46, No. 8, Aug. 15, 1992.

Melloch, M.R. et al. Incorporation of Excess Arsenic in GaAs and AlGaAs Epilayers Grown At Low Substrate Temperatures by Molecular Beam Epitaxy. Mat. Res. Soc. Symp. Proc. vol. 241, 1992 Materials Research Society.

Melloch, M.R. et al. GaAs, AlGaAs, and InGaAs Epilayers Containing As Clusters: Semimetal/Semiconductor Composites. Materials Science and Engineering, B22 (1993) 31-36.

Melloch, M.R. et al. Two-Dimensional Arsenic-Precipitate Structures in GaAs. Journal of Crystal Growth 127 (1993) 499-502.

Harmon, E.S. et al. Carrier Lifetime Versus Anneal in Low Temperature Growth GaAs. Appl. Phys. Lett. 63 (16), Oct. 18, 1993.

Feenstra, R.M. et al. Observation of Bulk Defects by Scaning Tunneling Microscopy: Arsenic Antisite Defects in GaAs. Physical Review Letters, vol. 71, No. 8, Aug. 23, 1993.

Feenstra, R.M. et al. Tunneling Spectroscopy of Midgap States Induced By Arsenic Precipitates in Low-Temperature-Grown GaAs. Appl. Phys. Lett. 63 (18), Nov. 1, 1993.

Mahadev, V. et al. Effect of Dopants on Arsenic Precipitation in GaAs Deposited at Low Temperatures. Journal or Electronic Materials, vol. 23, No. 10, 1994.

Atique, N. et al. Electrical and Structural Porperties of Be- and Si-doped Low-Temperature-Grown GaAs. J. Appl. Phys. 77 (4), Feb. 15, 1995.

Hong, S. et al. Stability of a Low-Temperature Grown GaAs Surface Layer Following Air Exposure Using Tunneling Microscopy. Appl. Phys. Lett. 68 (16), Apr. 15, 1996.

Tagare, M.V. et al. Heavy Be Doping of GaP and InxGa1-xP. J. Vac. Sci. Technol. B 14(3), May/Jun. 1996.

Lahiri, I. et al. Enhanced Diffusion in Nonstoichiometric Quantum Wells and The Decay of Supersaturated Vacancy Concentrations. Appl. Phys. Lett. 69 (2), Jul. 8, 1996.

Ng, T.B. et al. Inhibited Oxidation in Low-Temperature Grown GaAs Surface Layers Observed by Photoelectron Spectroscopy. Appl. Phys. Lett. 69 (23), Dec. 2, 1996.

Holden, T. et al. Reflection Anisotropy Spectroscopy Study of the Near-Surface Electric Fields In Undoped, n- and p-doped low-temperature grown GaAs (001). Physical Review B vol. 58, No. 12, Sep. 15, 1998.

Nolte, D.D. Semi-insulating semicanductor heterostructures: Optoelectronic Properties and applications. Journal of Applied Physics vol. 85, No. 9, May 1, 1999.

Geller, M.R. Quantum Phenomena in Low-Dimensional Systems. arXiv:cond-mat/0106256v1 Jun. 13, 2001.

\* cited by examiner

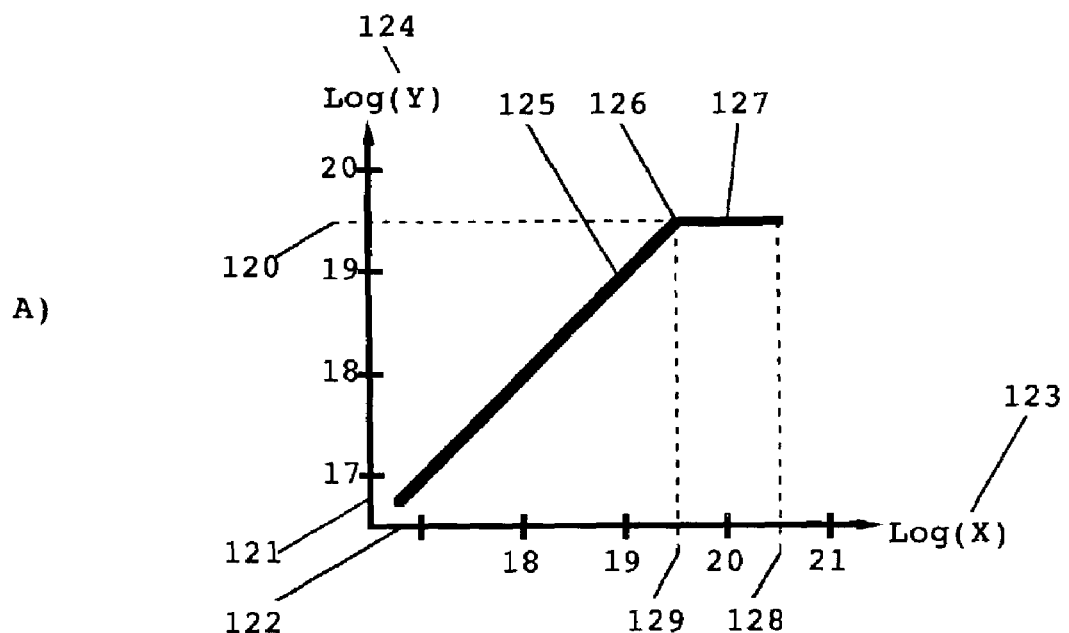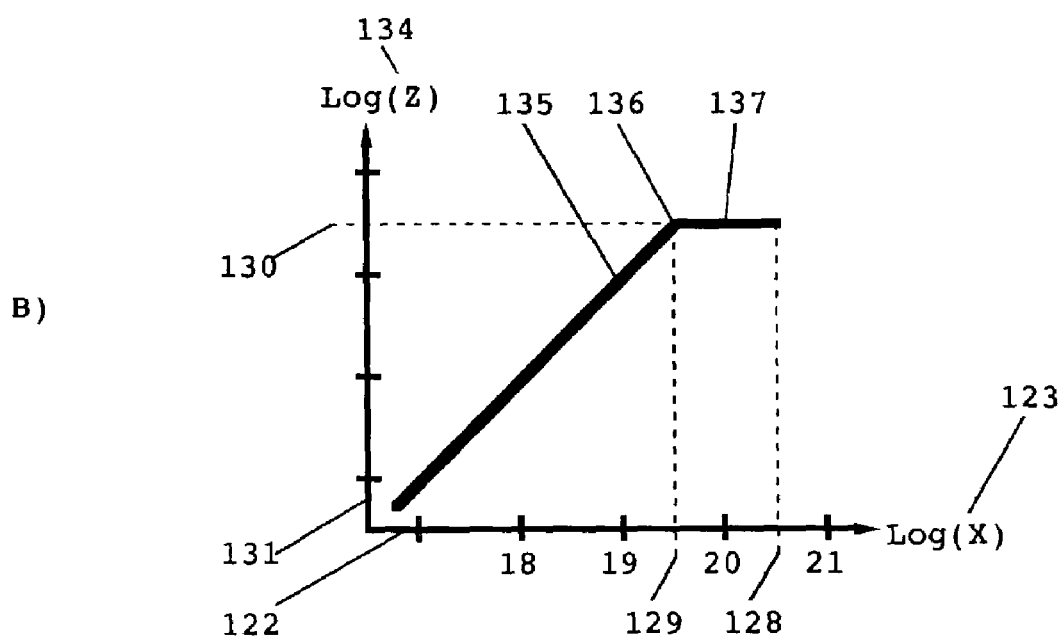
FIG. 1A-B

Figure 3
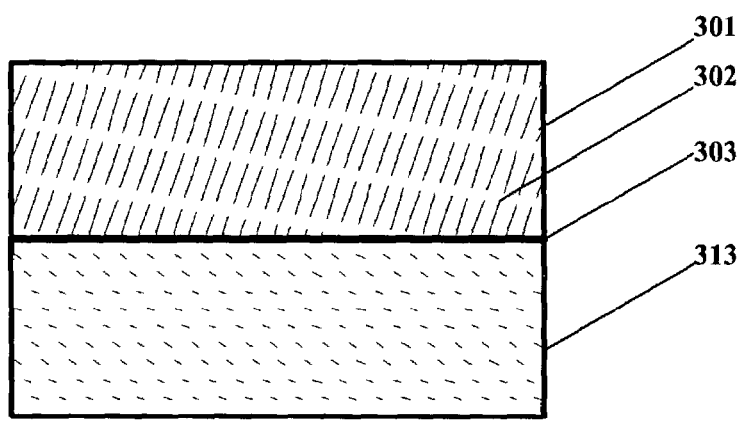
A)
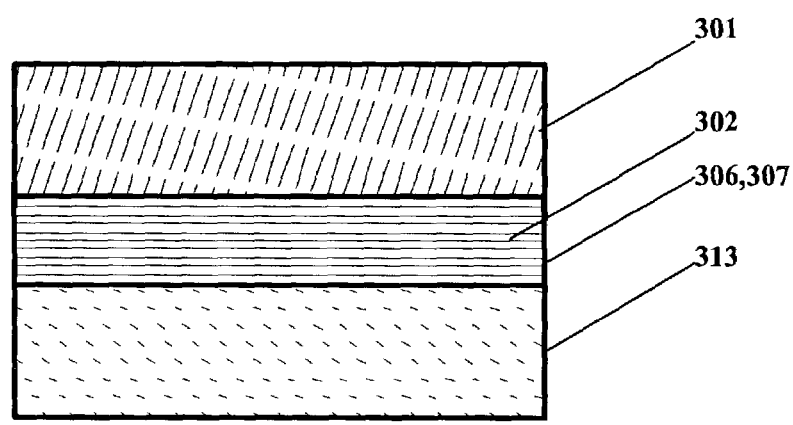
B)
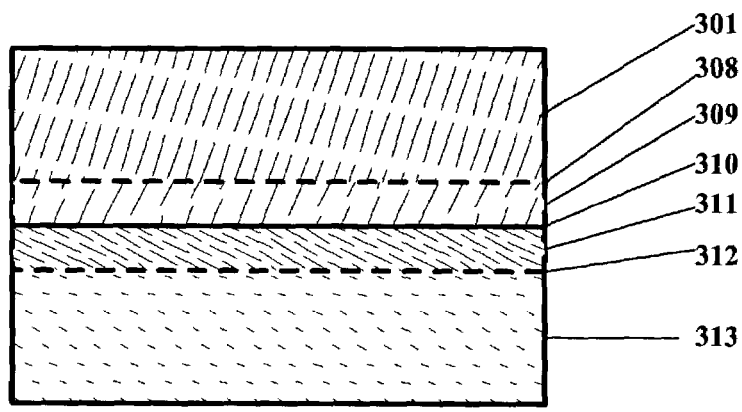
C)

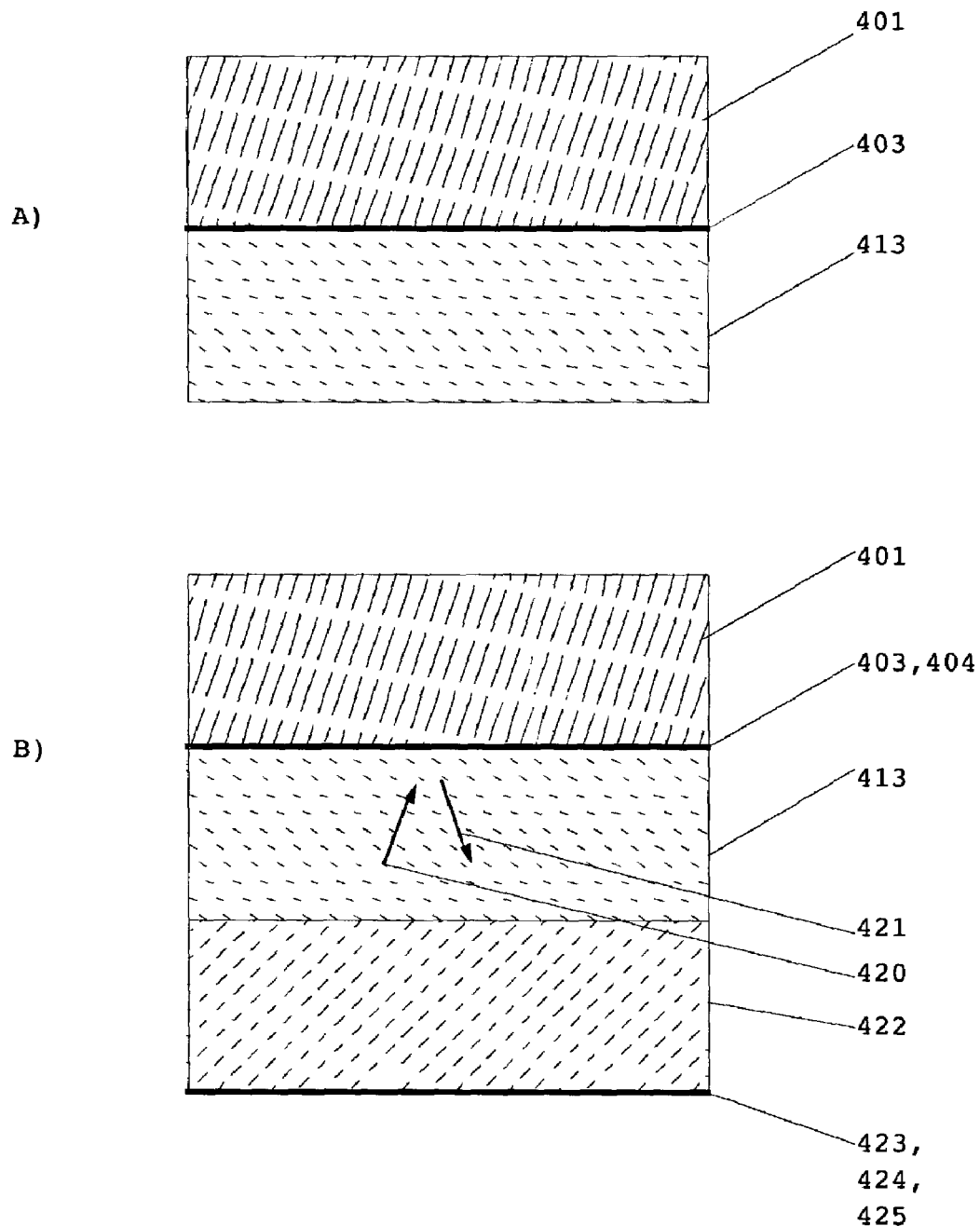
FIG. 4A-B

METHODS OF HYPERDOPING SEMICONDUCTOR MATERIALS AND HYPERDOPED SEMICONDUCTOR MATERIALS AND DEVICES

CROSS-REFERENCE TO RELATED APPLICATION

This application claims priority from U.S. Provisional Patent Applications 60/341,051 (filed Oct. 22, 2001) and 60/350,503 (filed Jan. 22, 2002), both of which are incorporated by reference herein.

FIELD OF THE INVENTION

This invention relates generally to the fields of solid-state physics and electronics, more particularly to the design and fabrication of semiconductor materials and devices, and still more particularly to the design and fabrication of semiconductor materials and devices for high-performance optoelectronic and microelectronic applications.

BACKGROUND OF THE INVENTION

Molecular beam epitaxy (MBE) is a well known and widely used technique for building semiconductor (or other) materials on a substrate. Typically, MBE directs neutral beams of molecules at a target substrate, while maintaining process conditions (e.g., substrate temperature, etc.) and stoichiometry that encourage growth of the desired material (typically, a semiconductor crystal, such as GaAs) on the target substrate. A wide variety of useful semiconductor devices can be fabricated, in whole or in part, using MBE processes.

It is known in the art that, for many MBE-grown materials and devices fabricated from them, doping during the MBE process can produce performance advantages. Generally speaking, the greater the doping during the MBE process, the greater the realized performance advantages for many high-speed devices.

Also well known in the art is the fact that for various host materials (also referred to herein as matrix materials) under given growth conditions, there will be a saturation limit for the carrier concentration produced by a dopant, and attempts to increase the dopant concentration beyond this limit will generally fail to raise the maximum practical carrier concentration in the matrix material, or even without apparent carrier saturation may produce counterproductive side effects. These side effects include degraded minority carrier lifetimes and enhanced dopant diffusion, which often limit device performance and reliability. Typically, a given dopant's carrier saturation limit is lower than the dopant's actual solubility in a particular matrix material. Table 1 below provides exemplary saturation limits and solubilities for several commonly used dopant/matrix material combinations.

TABLE 1

| Matrix | Dopant | Bulk Carrier Saturation Limit | Bulk Crystal Solubility Limit |
|---|---|---|---|
| GaAs | Be | $2 - 4 \times 10^{19}$ cm$^{-3}$ | $2 \times 10^{20}$ cm$^{-3}$ |
| GaAs | C | $1 - 2 \times 10^{20}$ cm$^{-3}$ | $5 \times 10^{19}$ cm$^{-3}$ |
| GaAs | Si | $1 \times 10^{19}$ cm$^{-3}$ | $2 \times 10^{20}$ cm$^{-3}$ |
| GaAs | Mg | $1 \times 10^{20}$ cm$^{-3}$ | $>10^{20}$ cm$^{-3}$ |
| InP | Be | $4 \times 10^{18}$ cm$^{-3}$ | about $10^{20}$ cm$^{-3}$ |

Prior art methods cannot effectively dope near or beyond the carrier saturation limit because dopant concentrations near or beyond the carrier saturation limit behave differently in the crystal lattice compared to the dopant at lower concentrations. For example, when a GaAs matrix is doped with a Group II p-type dopant such as Be, the Be atoms generally occupy Ga sites (i.e., substitute for Ga atoms) until the dopant approaches the critical carrier saturation limit. In general, at doping levels above the critical carrier saturation limit, approximately half of the incremental Be dopant ions reside on interstitial sites in the host matrix where they become donors, compensating for the incremental half occupying Ga sites as acceptors. For Be and other dopants, additional compensation mechanisms may be present, such as crystalline defects, including anti-site and vacancy defects, dopant precipitation, amphoteric dopant compensation, rapid diffusion of the dopant to lower doped regions, and enhanced incorporation of compensating background impurities such as oxygen.

These compensating mechanisms generally tend to result in an increase in the non-radiative trap density. Minority carrier lifetime is reduced in the presence of such non-radiative traps, resulting in the reduction of the efficiency of minority carrier devices. Thus, in a material doped beyond carrier saturation, minority carriers typically have a much higher probability of recombining non-radiatively than materials doped below carrier saturation. This increase in non-radiative recombination probability greatly diminishes the electroluminescence or photoluminescence associated with radiative materials, degrading the efficiency of light-emitting diodes (LEDs) or stimulated-gain devices, such as photo-pumped emitters, superluminescent diodes or lasers. Shortened minority carrier lifetimes also diminish bipolar transistor gain, $\beta$. Non-radiative recombination has also been linked to performance degradation over time, leading to reliability concerns. For example, interstitial atoms provide both a non-radiative recombination site and tend to diffuse rapidly at elevated temperatures or in the presence of high-electrical fields, aging the material and causing performance degradation and failures. For example, interstitial Be dopant atoms in the base of a npn heterojunction bipolar transistor (HBT) tend to rapidly diffuse into the emitter, especially at elevated temperatures and under current stressing, irreversibly degrading the performance of the HBT.

The limitations observed for Be-doped GaAs have motivated those ordinarily skilled in the art to seek better p-type dopant alternatives. One such alternative dopant is carbon (C). C has been shown to be capable of doping GaAs p-type to a hole concentration in excess of $10^{20}$ cm$^{-3}$ (see T. J. de Lyon, J. M. Woodall, M. S. Goorsky, and P. D. Kirchner, "Lattice-Contraction due to Carbon Doping of GaAs Grown by Metalorganic Molecular Beam Epitaxy." Appl. Phys. Lett., 56, 1990, p. 1040). However, such heavily C-doped GaAs appears to exhibit a significant degradation in minority carrier lifetime (See R. K. Ahrenkiel, R. Ellingson, W. Metzger, D. I. Lubyshev, and W. K. Liu, "Auger recombination in heavily carbon-doped GaAs," Appl. Phys. Lett., 78, 13, pp. 1879–81.), and experiments with heavily C-doped LEDs demonstrated a high cutoff frequencies but unacceptably low internal (hence, low external) quantum efficiencies for light-emitting applications, indicating a serious increase in the non-radiative recombination rate. (See T. J. de Lyon, J. M. Woodall, D. T. McInturff, R. J. S. Bates, J. A. Kash, P. D. Kirchner, and F. Cardone, "Doping Concentration Dependence of Radiance and Optical Modulation Bandwidth in Carbon-doped Ga$_{0.51}$In$_{0.49}$P/GaAs light-emitting Diodes Grown by Gas Source MBE." Appl. Phys. Lett., 60, 1992, p.

353). Nonetheless, C is rapidly becoming the p-type dopant of choice for the base region of commercial GaAlAs/GaAs HBTs, because C atoms predominantly substitute for As atoms in the GaAs crystal instead of occupying interstitial or Ga sites, up to and even beyond the solubility limit of carbon (C) in GaAs (see Table 1). Be dopant atoms, since they become interstitial much more readily than C dopant atoms, therefore migrate much more readily than C, and are comparatively unstable.

There are, however, critical limitations for C doping. In GaAs, the equilibrium solubility limit for C doping is only about $5 \times 10^{19}$ cm$^{-3}$. Doping C to a concentration above this amount can lead to formation of precipitates, which are known to degrade HBT performance. (See Q. Yang, D. Scott, J. Miller, P. Meyer, H. C. Kuo, J. E. Baker, and G. E. Stillman, "Precipitate formation in carbon-doped base of InGaP/GaAs heterojunction bipolar transistors grown by low-pressure MOCVD." *Appl. Phys. Lett.*, 74, 20, pp. 2993–5.)

Recombination may occur via parallel channels associated with different recombination mechanisms. For example, if a material has only a radiative recombination channel then only light is generated. However, if a material has in addition a non-radiative recombination channel (with a higher recombination rate), then non-radiative recombination will be dominant. Non-radiative recombination greatly degrades electroluminescence, as well as limiting HBT transistor gain to unacceptably low values. Additionally, p-type C doping is technologically more difficult for In-based III-V compounds and their alloys, e.g., InP and InGaAs. Therefore, there is a significant need in the field for an alternative to C doping.

OBJECTS AND SUMMARY OF THE INVENTION

In light of the above, one object of the present invention relates to methods for growing semiconductor materials with doping beyond conventional carrier saturation limits (hereinafter referred to as hyperdoped semiconductor materials or simply as materials) that do not display at least some of the deleterious side-effects that occur when conventional methods are used to dope beyond carrier saturation limits.

Another object of the invention relates to hyperdoped semiconductor materials.

Yet another object of the invention relates to useful devices (e.g., LEDs, transistors, detectors, lasers, etc.) made, at least in part, from hyperdoped semiconductors.

A further object of the invention relates to electronic, microelectronic and/or electro-optical systems comprised, at least in part, of devices made, at least in part, from hyperdoped semiconductor materials.

A still further object of the invention relates to methods for growing semiconductor materials at moderate substrate temperatures and/or at higher growth rates. In this regard it is noted that if the growth rate is sufficiently high, then carbon or any other dopant that tends to form precipitates (at lower growth rates) may be employed (e.g., Se) with an advantageous reduction in the probability of precipitation.

Another object of the invention relates to methods for growing semiconductor materials in an oxygen-poor environment.

Yet another object of the invention relates to methods for creating a semiconductor material including one or more dopants, while avoiding or mitigating the formation of one or more of the following effects ordinarily found at the doping level of said materials formed by prior art methods: (i) precipitation of the dopant; (ii) interstitial dopant; (iii) anti-site or vacancy compensation of the dopant; (iv) migration of a dopant; (v) amphoteric dopant compensation and/or (vi) non-radiative recombination centers.

A still further object of the invention relates to methods of fabricating semiconductor materials having lower resistance (i) in the bulk region, (ii) at the interface(s), (iii) at the surface and/or (iv) at the contacts.

A yet still further object of the invention relates to simplified processes for manufacturing high-performance semiconductor devices.

An additional object of the invention relates to processes for manufacturing high-performance semiconductor devices with higher yield.

Still further, another object of the invention relates to processes for manufacturing high-performance semiconductor devices utilizing more compatible combinations of materials.

Another object of the invention relates to processes for manufacturing semiconductor devices with superior operating properties, such as: (a) higher operating speed; (b) lower RC time constants; (c) greater power efficiency or lower power losses; (d) better heat sinking; (e) higher duty cycle; (f) lower threshold voltage; (g) superior operating voltage (h) lower threshold current; (i) higher gain; (j) higher stability; (k) higher radiometric efficiency; (l) higher quantum efficiency; (m) higher photometric efficiency; (n) higher brightness; (o) faster electro-luminescent modulation; (p) higher relaxation oscillation frequency; (q) lower relative intensity noise; (r) lower wavelength spread (breadth or narrowness); (s) optimized wavelength centroid; and/or (t) improved device-to-device reproducibility. Yet another object of the invention relates to processes for manufacturing improved-performance heterojunction bipolar transistors (HBTs) or similar devices with (i) relatively thinner base regions, (ii) higher base-region doping and/or (iii) lower extrinsic base resistance. Yet another object of the invention is to provide for a reduction in the surface recombination rate through the use of hyperdoped semiconductor material.

Yet another object of the invention is to provide for improved electrical contacts through the use of hyperdoped semiconductor material.

Still another object of the invention is to provide for a layer of semiconductor material having an electric field established through the layer by the use of hyperdoped semiconductor material to provide a doping gradient. A still further object of the invention is to provide for reduced device bulk resistance(s) through the use of hyperdoped semiconductor material.

Yet another object of the invention is to convert a semiconductor material that exhibits low radiative efficiency (usually less than 10% conversion efficiency) into a semiconductor material exhibits sufficient radiative efficiency (usually greater than 10% conversion efficiency) to be useful for optoelectronic devices. Conversion to higher radiative efficiency is achieved by hyperdoping to increase the rate of radiative recombination relative to the non-radiative component of recombination. For example, low radiative efficiency materials may occur due to low material purity, to crystalline defects, to high surface recombination velocity or to other non-radiative recombination mechanisms.

Accordingly, generally speaking, and without intending to be limiting, one exemplary aspect of the invention relates to methods for producing hyperdoped semiconductor materials by using a sufficiently high anion pressure to force substantially all of the dopant onto cation sites. A related embodiment uses a sufficiently high cation pressure to force substantially all of the dopant onto anion sites.

In accordance with one aspect of the invention, a method of generating a sufficient anion overpressure involves growing the hyperdoped semiconductor materials, at moderate substrate temperatures, in substantially oxygen-free environments using MBE. Examples of hyperdoped materials produced by the invention may include forming GaAs that is relatively free of non-radiative recombination centers and doped with Be at a concentration of greater than $2 \times 10^{19}$ cm$^3$, GaAs hyperdoped with Be at a concentration of greater than $4 \times 10^{19}$ cm$^{-3}$, GaAs hyperdoped with Be at a concentration of greater than $6 \times 10^{19}$ cm$^{-3}$, GaAs hyperdoped with Be at a concentration of greater than $8 \times 10^{19}$ cm$^{-3}$, GaAs hyperdoped with Be at a concentration of greater than $1 \times 10^{20}$ cm$^{-3}$, GaAs hyperdoped with Be at a concentration of greater than $1.2 \times 10^{20}$ cm$^{-3}$, GaAs hyperdoped with Be at a concentration of greater than $1.4 \times 10^{20}$ cm$^{-3}$, GaAs hyperdoped with Be at a concentration of greater than $1.6 \times 10^{20}$ cm$^{-3}$, GaAs hyperdoped with Be at a concentration of greater than $1.8 \times 10^{20}$ cm$^{-3}$, GaAs hyperdoped with Be at a concentration of greater than $2 \times 10^{20}$ cm$^{-3}$, GaAs hyperdoped with Si at a concentration of greater than $10^{19}$ cm$^{-3}$, GaAs hyperdoped with Mg at a concentration of greater than $10^{20}$ cm$^{-3}$, InP hyperdoped with Be at a concentration of greater than $4 \times 10^{18}$ cm$^{-3}$, or InP hyperdoped with Si at a concentration of greater than $1 \times 10^{19}$ cm$^{-3}$. Methods for producing hyperdoped semiconductor materials, in accordance with the invention, may further involve annealing the hyperdoped semiconductor material, at a high temperature, then rapidly quenching the material and optionally repeating the anneal-and-quench process once, twice, thrice or multiple times.

Methods for producing hyperdoped materials at moderate substrate temperatures, in accordance with the invention, may involve moderate temperature growth to facilitate a suitable excess anion pressure. In the preferred embodiment, moderate substrate temperatures will be in the range of 300–550 degrees Celsius (° C.), preferably 350–500° C., or, more specifically, substrate temperatures in the range of 350–375° C., 375–400° C., 400–425° C., 425–450° C., 450–475° C., 475–500° C., 500–525° C. and/or 525–550° C.

Growing hyperdoped semiconductor materials in a substantially oxygen-free environment may involve maintaining a partial pressure of less than $10^{-9}$ torr, and advantageously a partial pressure of less than $10^{-10}$ torr, and preferably a partial pressure of less than $10^{-11}$ torr, for oxygen atoms, oxygen molecules and oxygen radicals, as well as oxygen-containing compounds such as, but not limited to, water, oxides of gallium (e.g. from a Ga effusion cell or otherwise), arsenic oxide (e.g. from a arsenic effusion cell or otherwise) and dopant oxides. Growing hyperdoped semiconductor materials in a substantially oxygen-free environment may also involve maintaining partial pressures of oxygen-based contaminants that are sufficiently low to avoid substantial degradation of the hyperdoped semiconductor materials' electroluminescence and/or sufficiently low to avoid substantial formation of performance degrading non-radiative recombination channels in the hyperdoped semiconductor materials.

It is noted, in this regard, that during the growth of hyperdoped semiconductor materials in accordance with an aspect of this invention, a non-negligible partial pressure of certain gases containing other than oxygen may be present, such as nitrogen, and thus an ultra-high vacuum growth condition is not a completely strict requirement per se. Further, in this regard, these teachings may be practiced through the use of growth techniques other than MBE, such as through the use of low pressure chemical vapor deposition (CVD) or vapor phase epitaxy (VPE), so long as the atmosphere near the growth contains no oxygen and/or oxygen containing compounds, or a negligible fraction of oxygen and/or oxygen-containing compounds. CVD and VPE can be employed to grow hyperdoped materials at rates considerably faster than the MBE rates described in the preferred embodiment, e.g., CVD and VPE growth rates on the order of 60 μm of material per hour, more or less.

Methods for producing hyperdoped semiconductor materials at moderate substrate temperatures, in accordance with the invention, may also include growth rates in excess of 1 μm/hour, for example, growth rates of about 5 μm/hour.

Again, generally speaking, and without intending to be limiting, another exemplary aspect of the invention relates to methods for producing a hyperdoped GaAs crystal by, for example, growing GaAs, hyperdoped with one of {(i) Be at a concentration of greater than $2 \times 10^{19}$ cm$^{-3}$, (ii) Be at a concentration of greater than $4 \times 10^{19}$ cm$^{-3}$, (iii) Be at a concentration of greater than $6 \times 10^{19}$ cm$^{-3}$, (iv) Be at a concentration of greater than $8 \times 10^{19}$ cm$^{-3}$, (v) Be at a concentration of greater than $1 \times 10^{20}$ cm$^{-3}$, (vi) Be at a concentration of greater than $1.2 \times 10^{20}$ cm$^{-3}$, (vii) Be at a concentration of greater than $1.4 \times 10^{20}$ cm$^{-3}$, (viii) Be at a concentration of greater than $1.6 \times 10^{20}$ cm$^{-3}$, (ix) Be at a concentration of greater than $1.8 \times 10^{20}$ cm$^{-3}$, (x) Be at a concentration of greater than $2 \times 10^{20}$ cm$^{-3}$, (xi) Si at a concentration of greater than $1 \times 10^{19}$ cm$^{-3}$ or (xii) Mg at a concentration of greater than $10^{20}$ cm$^{-3}$}, using a moderate-temperature growth process to generate a suitable excess As anion pressure, such as a moderate substrate temperature MBE growth process, operated at a substrate temperature of {(a) 300–310° C., (b) 310–320° C., (c) 320–330° C., (d) 330–340° C., (e) 340–350° C., (f) 350–360° C., (g) 360–370° C., (h) 370–380° C., (i) 380–390° C., (j) 390–400° C., (k) 400–410° C., (l) 410–420° C., (m) 420–430° C., (n) 430–440° C., (o) 440–450° C., (p) 450–460° C., (q) 460–470° C., (r) 470–480° C., (s) 480–490° C., (t) 490–500° C., (u) 500–510° C., (v) 510–520° C., (w) 520–530° C., (x) 530–540° C. or (y) 540–550° C.}, and maintaining, during the growth process, a low partial pressure of oxygen and oxygen containing compounds of {(i) less than $2 \times 10^{-10}$ torr, (ii) less than $10^{-10}$ torr, (iii) less than $5 \times 10^{-11}$ torr, (iv) less than $2 \times 10^{-11}$ torr, (v) less than $10^{-11}$ torr, (vi) less than $5 \times 10^{-12}$ torr, or (vii) less than $2 \times 10^{-12}$ torr}, and using, during the growth process, a growth rate or rates that preclude a substantial amount of dopant incorporation on non-dopant sites such as interstitial sites, amphoteric compensating sites, or precipitates, thereby achieving hyperdoping, such as growth rates in a range of less than about 1 μm/hour to greater than about 5 μm/hour (if single crystal growth conditions can be maintained), more specifically growth rates in the ranges of about (A) 1.25–1.5 μm/hour, (B) 1.5–1.75 μm/hour, (C) 1.75–2.0 μm/hour, (D) 2.0–2.25 μm/hour, (E) 2.25–2.50 μm/hour (F) 2.50–2.75 μm/hour, (G) 2.75–3.0 μm/hour, (H) 3.0–3.25 μm/hour, (I) 3.25–3.50 μm/hour, (J) 3.50–3.75 μm/hour, (K) 3.75–4.0 μm/hour, (L) 4.0–4.25 μm/hour, (M) 4.25–4.50 μm/hour, (N) 4.50–4.75 μm/hour and (O) 4.75–5.0 μm/hour. Note that the markedly slower or faster growth rates achievable using MBE, VPE, MOCVD, and other well-known techniques are still in accordance with the invention. The invention may also create the excess anion pressure in GaAs by co-incorporating a suitable alternative anion pressure such as P, N, or Sb, with concentrations of the alternative anion (i) less than $1 \times 10^{-2}$ mole fraction, (ii) less than $1 \times 10^{-3}$ mole fraction, (iii) less than $1\times10^{-4}$ mole fraction, and (iv) less than $1\times10^{-5}$ mole fraction. Note that using alternative anion (or cation) delivery techniques rather than standard MBE effusion cells may be employed to effectively increase the anion (or cation) pressure. Such techniques may include using ionic forms of the anion, enabling the anion to be accelerated towards the substrate, electron-cyclotron resonance (ECR) sources, and jet vapor deposition techniques. The invention may also combine techniques for increasing the solubility limit such as co-doping enabling hyperdoping to achieve efficient doping beyond the solubility limit of the dopant in the matrix.

Still, generally speaking, and without intending to be limiting, another exemplary aspect of the invention relates to improved methods for fabricating semiconductor devices or specifically optimizing device performance, wherein the improvement comprises hyperdoping at least one of {(i) a base region, (ii) an emitter region, (iii) a collector region, (iv) a channel region, (v) a gate region, (vi) a source region, (vii) a drain region, (viii) a bulk region, (ix) an active region, (x) a passive region, (xi) a contact region, and/or (xii) a depletion region} by growing the hyperdoped region(s) using moderate temperature MBE process(es) with an excess anion or cation pressure that produces hyperdoped region(s) with dopant concentration(s) beyond non-hyperdoped carrier saturation limit(s). Growing the hyperdoped region(s) using moderate temperature MBE process(es) may further involve maintaining a substantially oxygen-free environment during the MBE process(es). Maintaining a substantially oxygen-free environment during the MBE process(es) may involve maintaining a partial pressure of less than $10^{-9}$, $2\times10^{-9}$, $5\times10^{-10}$, $2\times10^{-10}$ or preferably $10^{-10}$ torr for oxygen-based contaminants. Such substantially oxygen-free environments may be employed to avoid significant degradation of the hyperdoped semiconductor material's electroluminescence and/or to avoid significant formation of performance degrading non-radiative recombination channels in the hyperdoped semiconductor material. Use of hyperdoping to realize one or more the aforementioned region(s) produces at least one (and preferably two, three or more) of the following benefits in the fabricated semiconductor device(s): (a) higher operating speed; (b) lower RC time constants; (c) greater power efficiency; (d) lower power losses; (e) better heat sinking; (f) higher duty cycle; (g) lower threshold voltage; (h) superior operating voltage (i) lower threshold current; (j) higher gain; (k) higher stability; (l) higher radiometric efficiency; (m) higher quantum efficiency; (n) higher photometric efficiency; (o) higher brightness; (p) faster electro-luminescent modulation; (q) higher relaxation oscillation frequency; (s) lower relative intensity noise; (t) lower wavelength spread; (u) optimized wavelength centroid; and/or (v) improved device-to-device reproducibility. Growing the hyperdoped region(s) using moderate temperature MBE process(es) may involve operating the MBE process(es) at substrate temperature(s) in the range of 330–530° C. or, more specifically, one or more of 330–350° C., 350–370° C., 370–390° C., 390–410° C., 410–430° C., 430–450° C., 450–470° C., 470–490° C., 490–510° C. or 510–530° C.

Once again, generally speaking, and without intending to be limiting, another illustrative aspect of the invention relates to improved methods for producing hyperdoped semiconductor materials using MBE and other growth processes, wherein the improvement may involve operating the growth processes at moderate substrate temperatures and maintaining a low partial pressure of oxygen and oxygen containing compounds during the growth processes, and may involve maintaining growth rates of less than about 1 µm/hour to greater than about 5 µm/hour. Maintaining a low partial pressure of oxygen and oxygen containing compounds during the growth processes may involve maintaining a partial pressure of less than $10^{-9}$ torr, less than $10^{-10}$ torr, less than $5\times10^{-11}$ torr, or preferably less than $10^{-11}$ torr for oxygen and oxygen containing compounds. Such ultra-high vacuum conditions for oxygen and oxygen containing compounds are preferably selected to (i) avoid substantial degradation of the hyperdoped semiconductor materials' electroluminescent modulation and/or (ii) avoid formation of performance degrading non-radiative recombination channels in the hyperdoped semiconductor materials. A moderate temperature is typically a substrate temperature lower than that used for conventional growth, but higher than substrate temperatures that result in significantly degraded material quality. The conventional growth substrate temperature is typically the substrate temperature range that enables the production of high quality (low defect) undoped or lightly doped materials. A moderate substrate temperature may be a temperature in the range of 300–550° C., or preferably a temperature in the range of 350–500° C., or alternatively a temperature in the range of 350–375° C., 375–400° C., 400–425° C., 425–450° C., 450–475° C., 475–500° C., 500–525° C. or 525–550° C.

Yet again, generally speaking, and without intending to be limiting, another exemplary aspect of the invention relates to methods for producing hyperdoped semiconductor materials by, for example, combining in a growth chamber, such as a MBE growth chamber, a (i) matrix material illustratively selected from a compound semiconductor material containing one or more anions and one or more cations, such as {GaAs, InP, ZnS, ZnSe, InP, InAs, GaP, AlN, GaAlAs, GaInAs, GaInAsN, GaInAlAs, GaInAsP, AlP, GaAlP, InN, GaN, GaAlN, and related alloys} and (ii) a dopant illustratively selected from Cl, Si, Ge, C, Be, Zn, Mg, Cd, Se, Te and S, in which (i) the dopant concentration exceeds the carrier saturation limit for the selected combination of matrix material and dopant, and (ii) the growth chamber substrate temperature is in the middle third (or middle 50%, middle 40%, middle 30% or middle 20%) of the range of substrate temperatures over which the selected matrix material can be grown in the growth chamber.

The methods may further involve maintaining a substantially oxygen-free environment in the growth chamber. Maintaining a substantially oxygen-free environment typically involves maintaining ultra-high vacuum conditions in an MBE chamber, for example, a partial pressure of less than $2\times10^{-10}$ torr (or less than $7.5\times10^{-11}$ torr, less than $3.5\times10^{-11}$ torr or less than $10^{-11}$ torr) for oxygen-based contaminants including elemental oxygen, oxygen radicals and oxygen molecules, as well as oxygen containing compounds— including oxygen compounds delivered through the source molecular beams such as In, Ga, Al, As, P, Sb, N—thus avoiding substantial degradation of the hyperdoped semiconductor material's electroluminescent properties by formation of non-radiative recombination centers and/or significant formation of performance degrading non-radiative recombination channels in the hyperdoped semiconductor material. These inventive methods may employ MBE substrate temperatures in the range of 310–325° C., 325–340° C., 340–355° C., 355–370° C., 370–385° C., 385–400° C., 400–415° C., 415–430° C., 430–445° C., 445–460° C., 460–475° C., 475–480° C., 480–495° C., 495–510° C., 510–525° C., 525–540° C., 540–555° C., 555–570° C., 570–585° C., 585–600° C., 600–615° C., 615–630° C. and/or 630–645° C. And the involve one (or two, three, four or more) high-temperature anneal, followed by rapid thermal quench, step(s). The methods may also involve techniques to increase the anion (or cation) pressure such as using ionic or radical forms of the anion (or cation) to provide a suitable excess anion pressure.

Still further aspects of the invention relate to alternative combinations and permutations of the above-recited steps, elements, conditions, ranges and/or materials, consistent with, and/or in furtherance of, the teachings and objects of the instant invention. In particular, any patentable process, apparatus, article of manufacture or composition of matter that is taught by this application, whether in this section or elsewhere (such as in the Drawings or the Description of Illustrative Embodiments), should be considered part of the present invention.

BRIEF DESCRIPTION OF THE DRAWINGS

Various aspects, features, advantages and applications of the present invention are described in connection the Description of Illustrative Embodiments below, which description is intended to read in conjunction with the accompanying set of drawings, in which:

FIGS. 1A–B conceptually depict certain properties of carrier saturation due to dopant compensation;

FIGS. 3A–C depict a prior art process for creating an ohmic contact;

FIG. 4A depicts a tunneling ohmic contact made in accordance with the invention;

FIG. 4B illustrates an alternative use of the tunneling ohmic junction (of FIG. 4A) as an optical mirror;

Figure 2A:
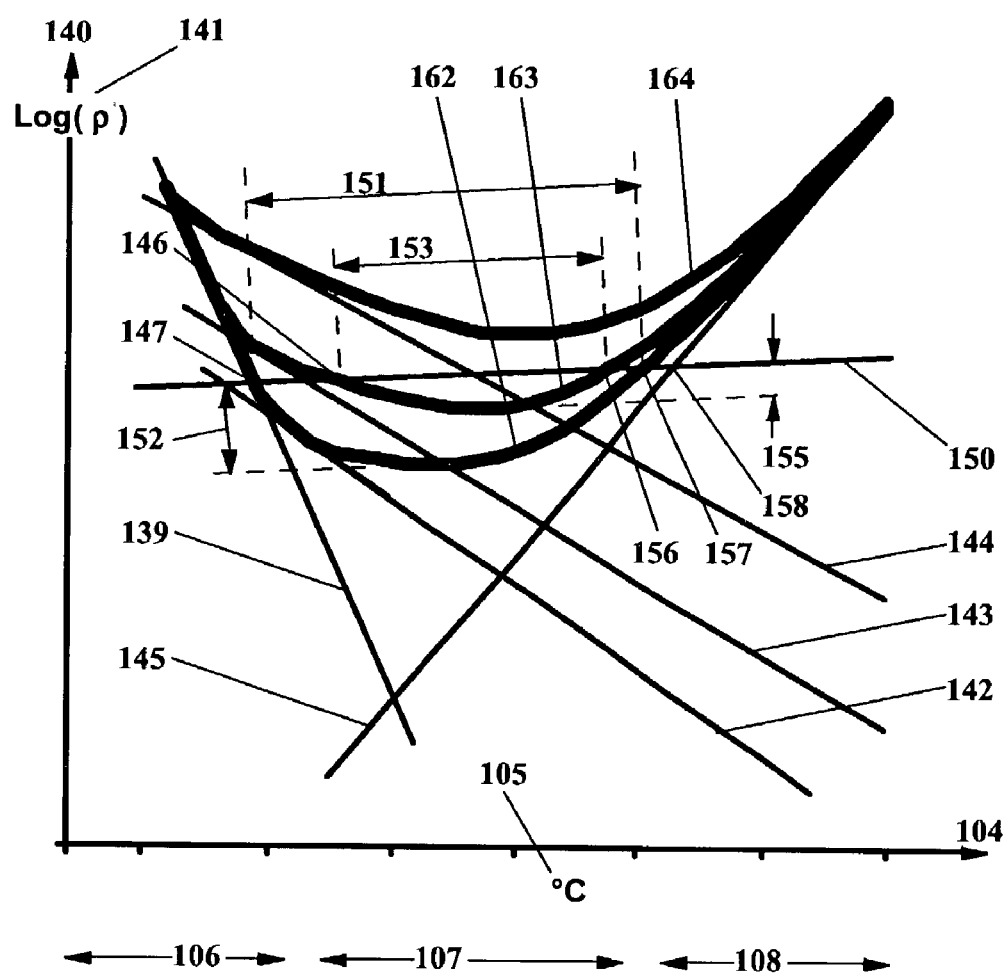
FIG. 2A conceptually depicts recombination channel probability as a function of growth temperature for the invention vs. the prior art, at high doping levels.

(Of course, as those ordinarily skilled in the art will appreciate, many of the drawings contain conceptual simplifications, and are not intended to indicate exact numbers or precise shapes.)

DESCRIPTION OF ILLUSTRATIVE EMBODIMENTS

As employed herein, a hyperdoped compound semiconductor material is a material having a suitable excess anion (cation) pressure incorporated into the matrix such that, compared to prior art materials, nearly all of the dopant atoms occupy cation (anion) sites, so that compensating effects such as interstitial dopants, amphotericity, crystalline defects such as anti-site or vacancy defects, dopant precipitation, or co-incorporation of contaminating species such as oxygen are greatly reduced. In a preferred, but not limiting embodiment on crystals containing GaAs, a process of hyperdoping involves creating an excess anion concentration (e.g., an excess As concentration) and permits the forcing of Be onto cation sites (e.g. Ga sites), without introducing a significant density of non-radiative recombination centers. Hyperdoping may be used to create materials with reduced radiative lifetime (because radiative lifetime is approximately proportional to doping density, higher doping densities result in shorter radiative lifetimes), without also creating a dominant density of non-radiative recombination channels. Or, hyperdoping can be used to create materials with increased probability of radiative recombination versus non-radiative recombination at a given doping level. Hyperdoping can also be used to create materials with increased doping concentration at a given minority carrier lifetime. Or hyperdoping may also be used to increase the total minority carrier lifetime at a given carrier concentration.

In one embodiment, the hyperdoping of a semiconductor material occurs in a growth chamber at medium or intermediate substrate temperatures (e.g., in a range of about 300–550° C., or preferably a temperature in the range of about 350–500° C. for GaAs), wherein substantially all oxygen atoms, radicals, molecules and/or oxygen-bearing materials and compounds have been excluded from the growth chamber (e.g., in a growth chamber having a partial pressure of less than $10^{-9}$ torr, less than $10^{-10}$ torr, less than $5 \times 10^{-11}$ torr, or preferably less than $10^{-11}$ torr for oxygen atoms, radicals, molecules and/or oxygen-bearing materials and compounds). In the preferred embodiment the growth chamber is part of a molecular beam epitaxy (MBE) apparatus, although in other embodiments the growth chamber could be, for example, part of a low pressure chemical vapor deposition (CVD) apparatus having a low partial pressure for oxygen atoms, radicals, molecules and/or oxygen-bearing materials and compounds.

In accordance with an aspect of these teachings, hyperdoping causes a compound semiconductor material to be anion rich during growth (i.e. have a plurality of anion atoms or an anion overpressure), such that the anion richness forces a high preponderance of dopant atoms onto cation sites where they persist after growth, yet the anion richness is not so excessive as to cause a significant degradation of the carrier transport properties (majority and/or minority) after growth. The excess anions are actually very effective at recombination, but the combination of high enough doping and low enough anions let other materials properties dominate, such as radiative recombination, etc. In other words, hyperdoping uses an anion overpressure created by judicious choice of materials, growth temperature, and cleanliness to force the dopant onto cation sites, but not to allow the excess anion or dopant to create a significant density of non-radiative traps. In the preferred embodiment, using an anion overpressure, hyperdoping increases the ratio of dopant on cation substitutional sites compared to dopant elsewhere. Alternative embodiments may use a cation overpressure, to increase the ratio of dopant on anion substitutional sites compared to dopant elsewhere. Compared to a prior art material at the same doping level, a hyperdoped material will exhibit a longer minority carrier lifetime and reduced dopant diffusion. Hyperdoping also allows higher carrier concentrations to be achieved than prior art growth methods by increasing the ratio of dopant on substitutional sites to dopant elsewhere.

Hyperdoping works because it commits a form of solid phase epitaxy. Recognition of the benefits of anion overpressure during growth by prior art researchers missed the central importance of inducing the overpressure internally within the bulk material, rather than applying it just externally at the growth interface. The present invention keeps the internal overpressure high during growth of the hyperdoped bulk state by incorporating excess anions at a non-stoichiometrically high density, but avoids significant subsequent creation of non-radiative traps. Prior art approaches to using non-stoichiometrically high anion density have typically used a low doping level (intentional or background), so the excess anions principally compensated the dopant, yielding semi-insulating material. Other prior art approaches to using non-stoichiometrically high anion density have typically used too high an density of excess anions, yielding material with excessively high non-radiative recombination rates.

In an alternative embodiment, hyperdoping causes a compound semiconductor material to be cation rich during growth (i.e. have a plurality of cation atoms or an cation overpressure) with plurality of anion vacancies during growth, such that the cation richness forces a high preponderance of dopant atoms onto anion sites where they persist after growth, yet the cation richness is not so excessive as to cause a significant degradation of the carrier transport properties (majority and/or minority) after growth. A hyperdoped material is a material formed by hyperdoping, or a material in which substantially all of a dopant is localized to substitutional sites, with a negligible density of dopant on antisites, interstitial sites, or present as diffusants, precipitates, inclusions, or other non-radiative traps.

As an example, in the preferred embodiment there is found to be an excess anion (e.g., As) mole fraction concentration of about $1 \times 10^{18}$ cm$^{-3}$ for a substrate temperature of 350° C. during growth, and an excess As mole fraction concentration of about $1 \times 10^{16}$ cm$^{-3}$ for a substrate temperature of 500° C. during growth. Note that as the substrate temperature increases during growth the excess anion concentration decreases.

The use of additive growth techniques (preferably, epitaxy) is not a limitation upon the practice of these teachings when forming a hyperdoped semiconductor material, since a hyperdoped semiconductor material can also be formed by implanting dopant atoms (e.g., Be atoms) and implanting excess anion atoms (e.g., As), in either order or simultaneously, into a semiconductor matrix material (such as GaAs), and then performing single or multiple rapid thermal anneal (RTA) cycles. The end result is that there is an excess of anions (As in this case), and the dopant atoms (Be in this case) are found mostly on cation substitutional sites (Ga in this case). Note that the excess anion atoms need not be identical to the matrix anions (e.g. by using P as the excess anion in GaAs instead of As). With suitable control of the excess anion, minority carrier lifetimes are increased compared with prior art techniques. In the case of direct band gap materials, Minority carrier recombination in hyperdoped semiconductor materials may be dominated by radiative recombination, where as prior art materials doped to the same concentration would be dominated by non-radiative recombination.

In other embodiments of this invention a hyperdoped semiconductor material may be doped with Mg, Se or some other dopant that exhibits a tendency to form precipitates or inclusions at normal growth rates (i.e., a growth rates typically less than about 1 μm/hour). In this case, increasing the growth rate to exceed 1 μm/hour (e.g., the growth rate may be in the range of greater than 1 μm/hour to about 5 μm/hour), so long as substantially single crystal growth can be maintained, may enable the formation of hyperdoped material without the formation of precipitates.

One aspect of these teachings provides a method or process for producing a hyperdoped compound semiconductor material by operating a growth chamber at a moderate growth temperature or temperatures while providing at least one anion, at least one cation and a selected dopant, and while maintaining a low background pressure for defect-inducing materials, particularly oxygen atoms, radicals, molecules and oxygen-containing or bearing compounds and materials. In accordance with this invention, in the resulting semiconductor material there is found an excess of anions, substantially all of the dopant atoms are located on cation substitutional sites, and minority carrier recombination in the resulting hyperdoped semiconductor material is dominated by radiative recombination.

An important aspect of these teachings is the utility of the longer non-radiative lifetime provided by a hyperdoped material. The suppression of non-radiative recombination mechanisms such as Shockley-Read-Hall (SRH) allows a device to achieve more efficient performance in spite of heavy doping, and even at the same doping. This aspect is particularly advantageous for devices like bipolar transistors where a longer minority charge carrier lifetime enhances performance. This aspect is also advantageous for letting a device achieve performance closer to the limits imposed by intrinsic recombination mechanisms like Auger and radiative.

A further aspect of these teachings is thus in providing a hyperdoped compound semiconductor material having at least one cation element, at least one anion element, and a selected dopant, wherein there is an excess anion concentration between x and y, where for the case of Group III-V compound semiconductor material containing As, x is about $10^{15}$ cm$^{-3}$ and y is about $10^{19}$ cm$^{-3}$. Higher values of y can sometimes be tolerated during growth or post growth annealing results in the precipitation or diffusion of excess anions out of the device's active region.

In order to more fully appreciate the invention and its many uses, it is appropriate to first consider why the majority carrier concentration level of a semiconductor crystal saturates. After explaining why such carrier saturation occurs, the most basic aspects of the invention are described in terms of materials with higher carrier saturation levels and moderate temperature methods of growing them. Exemplary applications and devices are then discussed.

The present invention is motivated, in part, by the inventors' discovery of how Be behaves as a dopant in GaAs. In particular, it has been determined, first, that at concentrations higher than $2 \times 10^{19}$ cm$^{-3}$, a significant fraction of Be incorporates as interstitial deep levels and, second, that these Be interstitials are primarily responsible for the carrier saturation, enhanced diffusion, and reduced minority carrier lifetime for GaAs heavily doped with Be.

Reference is now made to FIGS. 1A–B, which conceptually depict certain properties of carrier saturation due to amphoteric dopant compensation. In FIG. 1A, the majority carrier concentration 124 is plotted along the ordinate axis 121 as a function of dopant concentration 123 on the abscissa axis 122. In FIG. 1B, the excess free energy 134 is plotted along the ordinate axis 131 as a function of 123. Qualitatively, the majority charge carrier concentration increases with dopant concentration through a more-or-less linear regime 125, until reaching a carrier saturation limit 120, followed by a compensation regime 127, up to a dopant equilibrium solubility limit 128. It is important to recognize that dopants create extrinsic carriers in a crystal, which raise the crystal's excess free energy 134. Thermodynamics dictate that a semiconductor crystal find the lowest free energy state while being formed. This law drives a crystal toward being intrinsic, which is not always possible, but the crystal generally can limit its increase in excess free energy at higher doping concentrations, which it does by a process known as compensation beginning at 126 and 136.

The compensation mechanism by which crystals respond to increased free energy depends on the semiconductor material and its band gap energy. In particular, an effect known as compensation via amphoteric dopant (or amphoteric dopant compensation) can limit a crystal's excess free energy 134 to a level 130 by limiting the carrier concentration 124 to some critical level 120. Amphoteric dopant compensation dominates for relatively small band gap materials (generally below about 1.7 eV).

Compensation occurs via an amphoteric dopant compensation mechanism when the n (electron) or p (hole) carrier concentration 124 approaches a critical limit 120, beyond with the addition of more dopant atoms results in some of the dopant atoms being incorporated on donor sites, with other dopant atoms will be incorporated on acceptor sites, resulting in a compensation effect with reduces the effective dopant efficiency. The carrier concentration of the crystal is observed to be roughly constant at 120 for dopant concentrations at or above 129, shown generally as the region 127. Adding dopant beyond the carrier saturation limit 129 produces donors and acceptors in approximately equal quantities, so there is no further substantial increase of the majority carrier concentration at a dopant concentration beyond carrier saturation. In graphical terms, the excess free energy 134 is approximately linear as 135 up to a critical limit 136, but does not increase beyond 130 (i.e., stays approximately constant through region 137) for dopant concentrations from 129 up to solubility limit 128, because the carrier concentration 124 does not increase appreciably between carrier saturation at 129 and the equilibrium solubility limit of the dopant in the matrix at 128.

The inventors have observed this phenomenon in a number of commercially important semiconductors, including bulk crystals of GaAs doped with Ge or Si; epitaxial layers of Si-doped GaAs grown by MBE, MOCVD, or LPE; and Be-doped GaAs and GaAlAs grown by MBE or LPE. For instance, in a GaAs bulk crystal doped by Si, the Si atoms predominantly substitute for Ga atoms on Ga sites as a donor of free electrons up until about $1\times10^{19}$ cm$^{-3}$ (within a factor of about two, depending on exact crystal growth conditions). Above that concentration, Si dopants substitute for As atoms on As sites as often as for Ga atoms (amphoteric doping), so the majority carrier concentration does not increase, even well before Si reaches its solubility limit in GaAs at about $2\times10^{20}$ Si atoms cm$^{-3}$ of GaAs matrix. However, for Si hyperdoping occurs in the depletion layer near the crystal surface up to the solubility limit. Compensation, hence carrier saturation, also occurs in a GaAs crystal doped by Be at concentration 129 when, on average, one Be atom is added to an interstitial site (as a deep donor) for every Be added to a Ga site (as a shallow acceptor). For GaAs grown using standard epitaxial growth conditions, typically above 500° C., carrier saturation limit 129 typically occurs below $5\times10^{19}$ cm$^{-3}$.

Above solubility limit 128, other effects become important, most notably the formation of precipitates and/or the rapid diffusion of the dopant to lower doped regions. This is why doping a GaAs matrix with C achieves only about modest improvements over prior art doping of GaAs with Be or Si: The equilibrium solubility limit for C in GaAs is only slightly higher than the carrier saturation limit of Be. At C doping levels higher than the equilibrium solubility limit, the hole concentration continues to increase to about $1\times10^{20}$ cm$^{-3}$. However, C precipitates also form, yielding material with very small non-radiative minority carrier lifetimes, hence unacceptably low transistor gain.

Vacancy and/or anti-site self-compensation offers a second compensation mechanism. When it occurs, it can be more important than amphoteric dopant compensation. In wider band gap semiconductors (e.g., more than 1.25 eV, and usually more than 1.75 eV), a vacancy can occur with charge opposite to the ionized dopant's charge. For example, removing an Ga atom from a GaP lattice leaves a negatively charged (i.e., acceptor) vacancy behind, since Ga vacancies are normally a triple electron acceptor. Therefore, Ga vacancies can compensate an n-type dopant. Alternatively, an P anti-site (P atom on a Ga site in GaP) is a double electron donor, providing a compensation mechanism for ap-type dopant. Self-compensation of vacancies and anti-sites may occur in narrower band gap materials as well, although such self-compensation is usually not energetically favorable.

It is well known that the n-type or p-type character of a semiconductor is determined primarily by the stoichiometry it holds during its growth. For example, during the MBE growth of GaAs in an As-rich environment, excess Ga vacancies are thermodynamically favored over excess As vacancies. Si dopants therefore principally occupy Ga (donor) sites, and the bulk material crystal will end up n-type. By contrast, liquid phase epitaxy in certain temperature ranges provides a Ga-rich environment, so excess As vacancies are thermodynamically favored over excess Ga vacancies. In this case, the Si dopants principally occupy As (acceptor) sites, and the crystal ends up p-type. This well known behavior forms the basis of high efficiency Si-doped LEDs. Reference in this regard can be made to H. Rupprecht, J. M. Woodall, K. Konnerth, and D. G. Pettit, "Efficient Electroluminescence from GaAs Diodes at 300 K." *Appl. Phys. Lett.*, 9, 1966, p. 221. This reference shows that high efficiency LEDs can be made by using the amphoteric doping effect of Si using the LPE method. Amphoteric in this context means that Si can be made to be either an n-type dopant that resides on Ga Sites or a p-type dopant that resides on As sites. Which site is selected depends on the stoichiometry associated with the crystal growth environment.

One well-known technique, controlling the Fermi level at a surface, can also be used to avoid amphoteric Si dopant compensation in the surface depletion. However, this works best for n-type doping near the surface. As material is built up into a bulk, the Si at each former surface becomes amphoteric, with a fraction of the Si dopants switching from Ga sites to As sites and limiting the bulk doping to 120. This occurs because the Fermi level at the surface is pinned approximately mid-gap during crystal growth, so there is no free carrier saturation evident to dopants near the surface, and the electrons normally associated with the Si donors are more evident in surface states (as bound electrons). For example, if the Fermi level is pinned mid-gap during MBE growth, which occurs naturally for n-type materials during growth, Si will remain a donor dopant all the way up to its dopant solubility limit. This effect can be used to give high space charge density, hence narrow depletion width, and can be exploited to improve tunneling ohmic contacts. But the effect does not raise the carrier saturation limit for doping in the bulk material, because the excess free energy associated with the high free carrier concentration favors Si site switching to As sites in order to compensate the doping and reduce the excess free energy. However, Si hyperdoping can be achieved by using a suitable excess anion concentration and/or using faster growth rates to freeze in the surface doping levels, in accordance with an aspect of this invention.

One aspect of this invention avoids the site switching by Si and the formation of precipitates, such as Mg precipitates, by the use of higher than normal growth rates, such as growth rates in the range of about 1 μm/hour to about 5 μm/hour.

Traditionally, high Be doping in conventional (also known as high temperature grown or HTG) MBE growth gives rise to interstitial Be with donor dopant character and with an energy state between the conduction and valence bands. This mid-band energy state dominates the recombination mechanism with non-radiative capture.

By contrast, prior art low-temperature grown (LTG) GaAs material (typically at 200–350° C.) puts most of the Be on substitutional sites as intended, but also produces a high density of deep-level defects associated with the excess As. These defects similarly compensate the Be doping and dominate the carrier lifetime through non-radiative capture. More specifically, LTG produces heavily anion-rich materials, such as an As excess in a GaAs matrix. This large excess of anions tends to form a high concentration of crystalline defects, such as As on a Ga site, Ga vacancies, and/or As precipitates (especially after annealing). Defects and precipitates can dominate the minority carrier recombination lifetime in a crystal, thus limiting the benefits of high doping by way of LTG. In particular, such defects or precipitates can produce non-radiative traps (which ruin LEDs), inhibit population inversion (which ruins lasers, optical amplifiers, and wavelength converters), and annihilate electrons in a transistor's base region (preempting the transistor current and power gain).

Reference with regard to the formation of As inclusions in LTG Group III-V semiconductor materials can be had in U.S. Pat. No. 5,508,829, LTG AlGaAs non-linear optical material and devices fabricated therefrom, Apr. 16, 1996, by J. L Freeouf, R. T. Hodgson, P. D. Kirchner, M. R Melloch, J. M. Woodall and D. D. Nolte.

In view of the foregoing it can be appreciated that neither of the traditional MBE processes—HTG or LTG—is capable of meeting the recognized need for providing highly doped GaAs crystals with higher carrier saturation limits while dominated by radiative recombination.

A further aspect of the present invention relates to moderate temperature growth (MTG) MBE processes for producing highly doped semiconductor crystals with superior properties. For Be-doped GaAs, a typical MTG process in accordance with the invention would typically involve maintaining the substrate temperature in the range of roughly 350–500° C., which forces Be onto Ga sites as normal acceptors, without producing interstitial Be or creating such a large concentration of defects associated with excess As that the minority lifetime becomes degraded. MTG can occur at higher or lower temperatures, depending upon specifics of the matrix, dopant, and growth method.

Reference is now made to FIG. 2A which conceptually depicts recombination rates as a function of growth temperature 105 in accordance with the hyperdoped semiconductor material in accordance with this invention versus prior art high Be doping levels in GaAs. Ordinate 140 is a log-scale of the recombination rate 141. For non-radiative recombination, the recombination rate is generally proportional to the density of non-radiative traps. The abscissa 104 is the temperature of the GaAs substrate during MBE growth. (Of course, the curves are conceptual, and are not intended to convey quantitative details or the exact sequence of crossovers. The curves will differ for Be at other concentrations, for other dopants than Be, and for other matrices than GaAs. The curves will also differ for vapor deposition growth instead of MBE growth. Nevertheless, useful insights can be gained from FIG. 2A.) The curve 150 represents the radiative recombination rate, which is primarily a function of the majority hole concentration and, in general, is not dependent on the density of non-radiative traps or the growth temperature.

It is well known in the art that the incorporation of excess As in the GaAs matrix, which provide non-radiative recombination channels, is much more favored during growth at lower substrate temperatures. Accordingly, materials grown at lower substrate temperatures 106 exhibit a high non-radiative recombination rate, observed directly by photoluminescence experiments as short minority carrier lifetimes, or indirectly in devices incorporating LTG materials as fast, non-radiative recombination of minority carriers. This limit on the recombination rate due to excess As incorporation in the GaAs matrix is depicted in FIG. 2A as curve 139. GaAs doped with Be atoms at high enough levels (well beyond $10^{18}$ cm$^{-3}$) results in a significant fraction of Be atoms becoming interstitial during growth at higher substrate temperatures 108, such as the 500–650° C. and above typically used for conventional MBE deposition, and the interstitial Be atoms result in an increased non-radiative recombination rate. The non-radiative recombination rate due to Be interstitials is depicted conceptually as curve 145. For lower Be doping concentrations, Be is stable in the lattice and curve 145 would not have a significant temperature dependence (i.e. recombination due to interstitial Be at low doping densities is negligible for all substrate temperatures), so minority carriers in materials grown at temperatures up to normal can exhibit a lower probability of-non-radiative recombination so long as the doping level is kept low.

Oxygen contaminants—including oxygen atoms (i.e., O), radicals (e.g., O$^-$, O$^{2-}$, O$_3^-$), oxygen molecules (i.e., O$_2$) and oxygen-bearing compounds (i.e., OH$^-$, Ga$_2$O)—that bind with the semiconductor material typically bind to the lattice as deep donor non-radiative traps, and are significantly more likely to bind when the material is grown at MTG 107 than when grown at normal growth temperatures 108. The density of non-radiative recombination channels in a GaAs matrix grown in a substantially oxygen-free environment (a/k/a ultra-trace or better) is approximated in curve 142. The commercial trend toward ever-cleaner MBE growth chambers makes curve 142 the practical objective. By contrast, the density of non-radiative recombination channels due to the non-negligible presence of O atoms is shown as curves 143 and 144, these latter curves being higher. When material is grown by LTG 106, O complexes form with even higher probability. Materials grown at normal substrate temperatures 108 tend not to have high O density unless a gettering material like Al is present in the matrix, since the O source(s) ride on the hot surface without combining or binding, thereby not incorporating into the GaAs matrix. This means that the curves 142, 143, and 144 will typically converge at or near HTG temperatures.

The curves labeled 162, 163 and 164 correspond to the total non-radiative recombination for the three different examples of background oxygen levels. Curve 162 represents the sum of curves 139, 142 and 145, and crosses curve 150 at points 147 and 157. Curve 163 represents the sum of curves 139, 143 and 145, and crosses curve 150 at points 146 and 156. Curve 164 represents the sum of curves 139, 144 and 145 and does not cross curve 150 in this example. Of course, material grown at any temperature to the right of point 158 (defined by the intersection of curves 145 and 150) or the left of point 159 (defined by the intersection of curves 139 and 150) is likely to be dominated by non-radiative recombination of minority carriers, due to the relative slopes of the exemplary curves.

Curves 162, 163 and 164 have minima at progressively higher points, leaving regions wherein the probability of radiative recombination would be expected to dominate (i.e. be above) the probability for non-radiative recombination by amounts that are, respectively: significant 152, little 155, or not. Curves 163 and 164 are typical of the prior art; at moderate substrate temperatures, they respectively produce materials in which minority carriers have a predominantly radiative or non-radiative recombination mode, respectively.

For curve 162 in accordance with the invention, radiative recombination dominates in the region with maximum height 152, width 151, and substrate temperatures between 147 and 157. As the ordinarily skilled reader will appreciate, the ratio of the radiative to non-radiative recombination curves (in FIG. 2A) corresponds to the ratio of radiative to non-radiative recombination densities or, equivalently, probabilities. Thus, substrate temperature width 151 illustrates the concept of MTG in accordance with the invention. Of course, there can also be a sweet spot, as is the case in this example at the temperature where 152 is measured. For the curve 163 in accordance with the prior art, radiative recombination dominates only in the region with height 155, width 153 and substrate temperatures between 146 and 156. Significantly, for material grown in accordance with prior art curve 164 which is always above 150, non-radiative recombination dominates radiative recombination for material grown at all substrate temperatures.

Previous attempts have been made to investigate substrate temperatures intermediate between LTG and normal growth (HTG), but none have produced promising results. The present inventors have recognized that the prior art MTG failures were most likely caused by O contamination. In contrast to conventional wisdom in the field, the present inventors have recognized the importance of trace O, and the desirability of taking specific steps to avoid its presence, in order to realize the greatest benefits from the invention.

Explaining prior art failures in terms of FIG. 2A, the inventors believe that previous investigators did not appreciate that curve 142 existed, nor that it lay below (and to the left of) curves 143 and 144. The density of non-radiative recombination channels in a GaAs matrix grown by prior art methods (i.e., with oxygen present well-above ultra-trace levels) has therefore been excessive, as illustrated by the greater height (along 140) of curves 143 and 144 than of curve 142.

In light of the above, it is clear that the invention's preferred method of growing materials in an oxygen-poor environment (i.e. oxygen at only ultra-trace concentration levels) provides significant and non-obvious advantages over traditional methods. In accordance with this aspect of the invention, oxygen (which may appear as $O_2$, $O^-$, $O^{2-}$, $OH^-$, oxides of gallium and other species, or be derived from other oxygen-bearing alloys or mixtures) is preferably reduced below the total pressure of approximately $10^{-9}$ torr that is typical of present-day MBE chambers. It is most preferred to provide a partial pressure associated with oxygen and/or oxygen bearing materials below $10^{-11}$ torr. It is noted that a higher partial pressure may be used if the defect density of the material being grown, due to oxygen or other elements, can be kept well below about $10^{16}$ defects per $cm^3$, and especially below about $10^{16}$ defects per $cm^3$, such as below $10^8$ defects per $cm^2$ per molecular layer. Since the ratio of radiative to non-radiative lifetimes matters more than the absolute lifetimes, a direct band gap material with a shorter radiative recombination lifetime can tolerate a higher defect density, such as $10^{18}$ defects per $cm^3$.

Several methods for sustaining an ultra-high vacuum are well known in the fields of epitaxial growth, vapor deposition, and vacuum science. Typically, an ultra-high vacuum chamber and its contents are made and kept clean, and baked out to dislodge water monolayers. Only low-outgas materials are tolerated. During use, the chamber and contents are subject to high speed vacuum pumping to remove molecules from the volume, and the chamber is advantageously kept cold (e.g., at liquid nitrogen temperature) to reduce desorption further.

Methods for reducing oxygen contamination are also well known, and include: using extreme high vacuum conditions, such as by cooling to $^3$He temperatures to make wall accommodation times effectively infinite; introducing an appreciable surface area of gettering material such as Al, Ti, or Mg; introducing a species of a low vapor pressure, non-refractory gettering material into one or more of the evaporation cells, such as 100 mg of Al, Mg, or Be added to 10 g of Ga, the gettering material and Ga being melted together in order to complex and capture oxygen introduced as GaO, $Ga_2O_3$, or other contaminants. These, as well as other techniques or methods can be used to maintain advantageous environmental conditions for the practice of the invention.

Theory: In order to better appreciate certain aspects of the invention, it is helpful to consider, in detail, the doping thermodynamics of Be. When GaAs is doped with Be, the concentration of Be dopant on Ga sites, $Be_{Ga}$, is in thermodynamic equilibrium with the sum of the Ga vacancy concentration, $V_{Ga}$, plus the Be interstitial concentration, $Be_i$:

$$Be_{Ga} \Leftrightarrow V_{Ga} + Be_i \quad (1)$$

There is also an electronic equilibrium. The concentration of neutral Be on Ga sites is defined as $N_A$, and $N^-_A$ is the concentration of ionized Be on Ga sites. Such atoms are shallow p-type acceptors. The concentration of interstitial Be is defined as $N_D$, and the concentration of ionized interstitial Be is defined as $N^+_D$. Such atoms are deep donors.

Simultaneously, the concentration of neutral Be on Ga sites, $N_A$, is in equilibrium with the sum of the concentration of ionized Be on Ga sites, $Be^-_{Ga}$, plus the concentration of holes, p. That is, $Be_{Ga} \Leftrightarrow Be^-_{Ga} + p$. Substituting from (1), we find $N_A \Leftrightarrow V_{Ga} + N_D \Leftrightarrow N^-_A + p$. The concentration of neutral Be on interstitial sites is in equilibrium with the sum of the concentration of ionized Be on interstitial sites plus the concentration of electrons, n. Solving for $N_D$ tells us that $N_D \Leftrightarrow N^+_D + n$.

In the well-known Schottky vacancy equilibrium equation, $V_{Ga} = K'(T) \times P_{As2}$, where $K'(T)$ is a mass action constant relating the Ga vacancy concentration, $V_{Ga}$, to the As pressure, $P_{As2}$. Collecting terms from these equations leads to a final equation relating the concentration of ionized Be on acceptor sites to the concentration of ionized Be on donor sites:

$$N^-_A/N^+_D = (K'(T) \times P_{As2}) \times (n_i/p)^2 \quad (2)$$

where $n_i$ is the intrinsic carrier concentration of the material at temperature T, and $n_i^2 = (n \times p)$ at equilibrium.

At low doping concentrations, the material is intrinsic, and the $(n_i/p)^2$ term is unity. If the $(K'(T) \times P_{As2})$ term is >1, the material is p-type by definition and $(N^-_A/N^+_D)>1$, meaning $N^-_A>N^+_D$. If the $(K'(T) \times P_{As2})$ term is <1, the material is n-type by definition and $(N^-_A/N^+_D)$ 1, meaning $N^-_A<N^+_D$.

For higher doping levels, $p>n_i$ so $(n_i/p)^2<1$. The physics is now clear. Reorganizing equation (2), carrier saturation occurs when $$(n_i/p)^2 = 1/(K'(T) \times P_{As2}) \tag{3}$$

so the $(N^-_A/N^+_D)$ term approaches unity.

For thermodynamic reasons, the material can never cross from p-type to n-type by the addition of more p-type (e.g., Be) dopant, nor from n-type top-type by the addition of more n-type (e.g., Si) dopant. This is often expressed by stating that the limiting value of $\log(N^-_{A/N}{}^+_D)$ cannot change sign, lest increasing the dopant concentration force a change in sign from n-type top-type or vice versa, which would be unphysical. Equation (3) is an algebraic realization of carrier saturation via increased doping by the same dopant, so precludes $(n_i/p)^2$ on the left-hand side of equation (2) from growing any smaller beyond the point of carrier saturation.

How can one use this insight to increase the critical saturation limit: in other words, make p larger and $(n_i/p)^2$ smaller, without changing the sign of $\log(N^-_A/N^+_D)$? As the ordinarily skilled reader will appreciate, several avenues are available, separately or in combination. One could raise the crystal's temperature, T, thereby raising n, regardless of the impact on K'(T). One could also raise K'(T) by some method. And/or one could raise the As pressure, $P_{As2}$, during crystal growth.

Raising $n_i$ during growth is challenging, due to surface degradation at higher growth temperatures. There are, nevertheless, many ways to raise n, in accordance with the invention, such as using one or more rapid thermal quenches after one or more relatively high temperature anneals. Such anneal cycle(s) should preferably be kept brief, since there are generally important upper limits on sustained substrate temperature during MBE growth. Specifically, a rapid high temperature thermal anneal and quench raises $n_i$, whose effect in equation (2) is quenched upon return to room temperature, which in turn raises $N^-_A/N^+_D$ upon return to room temperature.

Another approach to raising n, would be to raise $P_{As2}$. Note, however, that increasing the partial pressure of As (arsenic flux) during growth does not, by itself, raise $P_{As2}$, since the surface of GaAs is already As-saturated during growth.

Hyperdoping, in accordance with the invention, may include one or more of these approaches, but preferably also includes lowering the substrate temperature during growth to the MTG range where sufficient excess As (over the stoichiometric amount) is incorporated into the crystal to maintain a very high As pressure internal to the crystal (as opposed to external As pressure induced by the beam flux at the growth surface). At lower substrate temperature, LTG has been shown in the past to lead to a very high excess of anions, notably As, resulted in degraded semiconductor properties associated with the excess As. (See, for example, U.S. Pat. Nos. 5,371,399 and 5,471,948, incorporated herein by reference.)

It is noted that hyperdoping, in accordance with an aspect of these teachings, may also be accomplished by performing, for example, a Be implant and an anion, e.g., As implant into the semiconductor material, followed by one or more rapid thermal anneal (RTA) cycles.

A preferred embodiment of the invention uses an excess of anions (e.g., arsenic) produced by MTG to raise the effective anion pressure at the crystal surface during growth. However, an excess of As favors the incorporation of dopants on cation sites via the increased As pressure, but may or may not itself create cation vacancies. Other alternatives include As anti-sites (As on cation sites) and interstitial As, among others. This technique can be used to raise the carrier saturation concentration of majority carriers that occurs in a doped semiconductor, such as Be-doped GaAs, Si-doped GaAs, and so forth. In accordance with the invention, hyperdoped materials may have an increased carrier saturation concentration of majority carriers compared to prior art materials.

As those ordinarily skilled in the art will recognize, the hyperdoping and MTG techniques of the present invention are readily applicable to other compound semiconductors where excess anion incorporation is possible, such as III-V materials like InP, GaP, GaN, etc., and II-VI materials like ZnS, ZnSe, etc. Hyperdoping also generalizes to other Group IV amphoteric dopants, such as Si, Ge, C, and so forth; other Group II amphoteric dopants, such as Be, Zn, Mg, Cd, etc.; and other compound semiconductors, such as InAs, GaP, GaAlAs, GaInAs, GaInAsN, InN, GaN, AlN, GaAlN, InGaN and related compounds. For instance, the method can be used to improve the doping efficiency of GaAs and GaP by raising the anion concentration during growth at 300–600° C. (which bracket the MTG substrate temperatures for these materials), where the anion is advantageously N, As, P, or some combination thereof A rapid thermal anneal (RTA) at a high substrate temperature (such as 900° C.) may then advantageously employed.

Self-compensation by anion vacancies is actually quite common, such as when Se vacancies compensate p-type nitrogen doping in ZnSe. Hyperdoping is not limited top-type materials. The inventors have also created n-type doping in wide band gap materials limited by self-compensation via cation vacancies instead of via anion vacancies. Unsuspected self-compensation by cation vacancies is a key reason why some materials are considered infeasible to produce with n-type conductivity. Hyperdoping enables certain of such materials to be produced with n-type conductivity.

While high p-type hyperdoping is generally preferred, because electrons are faster minority carriers than holes, applications exist for which high n-type hyperdoping would be valuable. For example, in a GaAlAs/GaAs heterojunction field effect transistor (HFET), the channel can be doped n-type or p-type. In an n-channel device, the FET is modulated from accumulation (electrons in the channel) to depletion (electrons absent from the channel). When the heterojunction barrier for electrons is small, it is better to achieve accumulation via direct doping of the channel rather than modulation doping. When scaling to small dimensions to increase density and/or speed, high n-type doping is desirable, so n-channels of HFETs hyperdoped n-type with Si can be advantageous.

When using Si doping to make n-type GaAs, the solubility limit of Si in GaAs is usually less than $2 \times 10^{20}$ cm$^{-3}$, whereas the equilibrium bulk carrier saturation is about $1 \times 10^{19}$ cm$^{-3}$ due to self compensation via the amphoteric nature of Si. However, in the depletion region during growth caused by surface Fermi level pinning, the ionized donor saturation is equal to the solubility limit of 1 or $2 \times 10^{20}$ cm$^{-3}$. Therefore, if a crystal is doped to the Si solubility limit and then exposed to a rapid thermal anneal and quench, the space charge density at the surface, $N_D$ minus $N_A$, will equal the solubility limit. This use of hyperdoping facilitates making non-alloyed ohmic contacts, as described below.

Figure 2B:
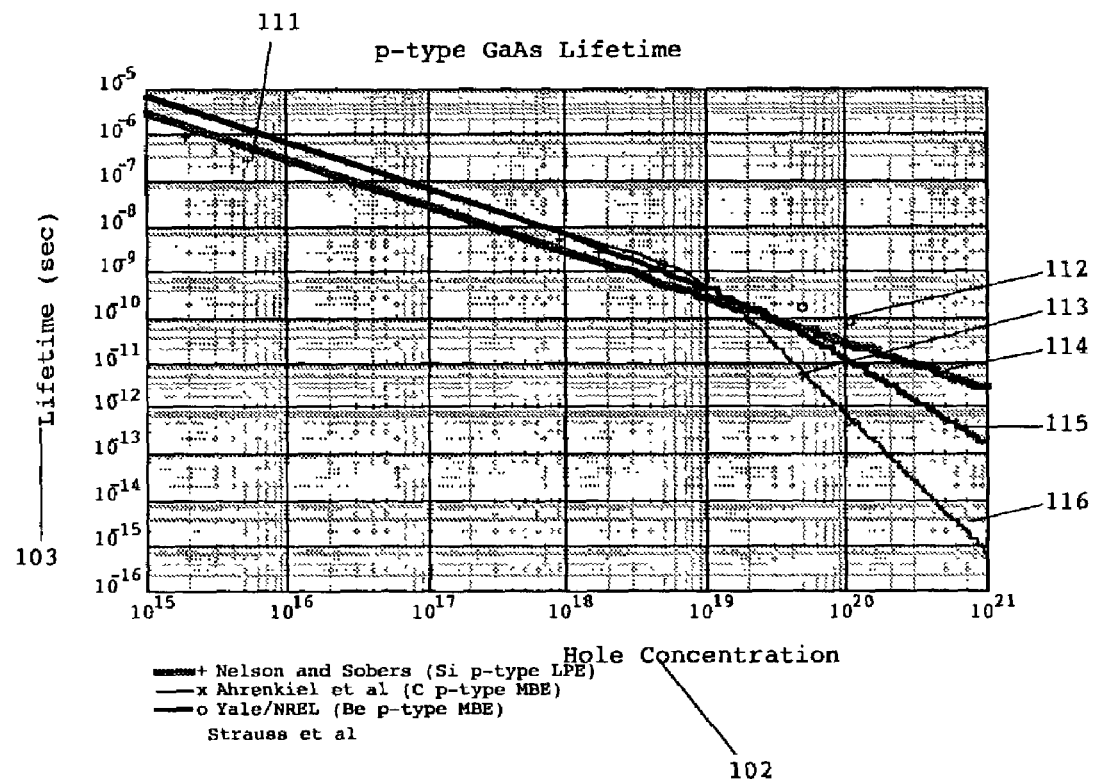
FIG. 2B plots carrier lifetimes for several prior art and exemplary inventive materials.

Reference is now made to FIG. 2B, which shows carrier lifetimes for several prior art and exemplary inventive materials. In the figure, the total minority electron lifetime, 103, is plotted as a function of the majority hole concentration 102. As is well known in the art, the radiative lifetime of carriers in a direct band gap semiconductor material varies inversely as the concentration of dopant 102 up to a critical point for the material. In contrast with traditional thinking in the art, hyperdoping allows the critical point to be extended to a higher doping level, thus allowing the radiative lifetimes of carriers in hyperdoped materials to be reduced below generally accessible limits available in prior art materials. The inventors have established that stoichiometry during semiconductor crystal growth determines the critical doping level at which carrier saturation occurs, not just the n-type or p-type character, so controlling stoichiometry during growth enables a higher critical doping level to be achieved.

For direct band gap semiconductors such as GaAs, minority carrier lifetimes are typically dominated by radiative lifetimes, so long as the majority of recombination events are radiative. Radiative lifetimes are, in turn, controlled by the majority carrier doping concentration, assuming the majority carrier dopant resides on the appropriate atomic sites of the host crystal and there are no other significant non-radiative carrier recombination mechanisms present (such as deep level traps, crystal defects, and so forth). Accordingly, to achieve maximum electro-optical performance (manifested by high speed and high efficiency) from Be-doped GaAs, four factors are particularly important: (a) substantially all of the Be dopant should reside on vacant Ga atomic sites; (b) the concentration of interstitial Be atoms should be relatively small; (c) the crystal should be relatively free of point, line, or interface defects, such as vacancies, dislocations, grain boundaries, or precipitates; and (d) impurity atoms which can trap carriers (such as Ni, Cu, Cr, O) should be kept as low as possible. When these objectives are met, the minority carrier lifetime, $\tau_n$, is inversely proportional to the ionized majority carrier doping concentration, $N^-_A$.

This inverse relationship holds until some other minority carrier dynamic becomes significant. This is depicted in FIG. 2B, wherein the inventors have established that hyperdoping with Be beyond $10^{19}$ cm$^{-3}$ still produces materials in which the minority carrier (electron) lifetime is still dominated by the radiative lifetime, and not by Auger recombination or other non-radiative mechanisms.

By contrast, the prior art 113 (fit by the curve 116) produces non-radiative recombination (using C doping) somewhere between $10^{19}$ cm$^{-3}$ and $10^{20}$ cm$^{-3}$. (See R. K. Ahrenkiel, R. Ellingson, W. Metzger, D. I. Lubyshev, and W. K. Liu, "Auger recombination in heavily carbon-doped GaAs." *Appl. Phys. Lett.*, 78, 13, pp. 1879–81.) Moreover, although high C doping can raise the carrier concentration and shorten carrier radiative lifetime, C doping at all levels appears to introduce a significant density of non-radiative recombination centers into the crystal, and those centers dominate the minority carrier lifetime (which ruins LEDs) and lowers the gain and/or speed of transistors. Consequently, C doped devices are typically slower and of lower radiative efficiency than comparable Be devices hyperdoped to the same dopant concentration.

Curve 111 shows data on Si p-type GaAs grown by LPE from Nelson and Sobers (R. J. Nelson and R. G. Sobers "Minority-carrier lifetime and internal quantum efficiency of surface-free GaAs," Journal of Applied Physics 12, 49, pp 6103–6018, 1978), fit by curve 114. Curve 112 shows data on Bep-type GaAs grown by MBE in accordance with the invention and measured by Keyes at NREL. Curve 115 shows data by Strauss et al.

Figure 2C:
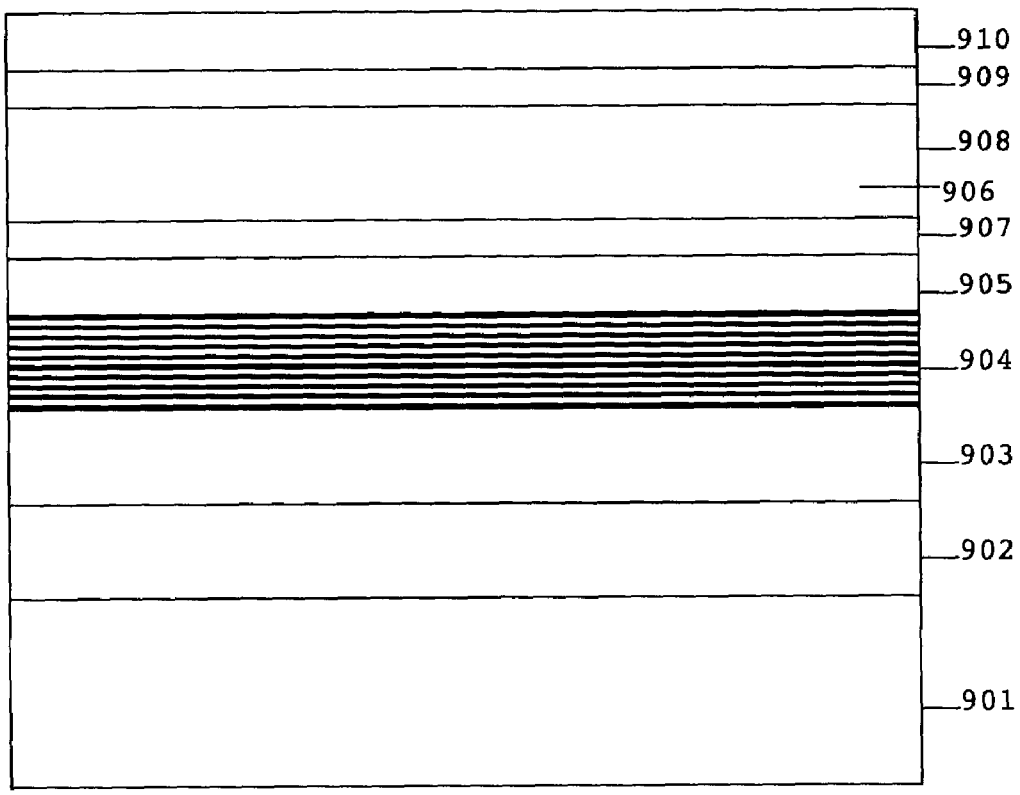
FIG. 2C depicts an exemplary test structure fabricated using the inventive process.

Reference is now made to FIG. 2C, which depicts an exemplary test structure fabricated using the inventive process. Time resolved photoluminescence test structures incorporating a layer of hyperdoped GaAs material were grown with an EPI Gen II solid source MBE system upon a two inch diameter Vertical Gradient Freeze semi-insulating GaAs substrate. Substrate 901 was mounted on a non-bonded substrate mount. Substrate 901 was out-gassed for 90 minutes at 350° C. in the buffer chamber of the MBE. Substrate 901 was then loaded into the growth chamber. In the growth chamber, the substrate temperature was measured with a thermocouple. Substrate 901 was heated to a temperature 615° C. for 5 minutes to desorb the surface oxides. The substrate temperature was then reduced to its initial growth temperature of 600° C.

The growth rate for all layers was maintained at 1 µm per hour. The initial GaAs was grown at an As cell temperature 980° C. to give an As overpressure. A buffer layer 902 of 0.5 µm of undoped GaAs was grown. The substrate temperature was then reduced to 250° C. in order to enable growth of a 0.5 µm LT-GaAs buffer layer 903 to reduce the migration of impurities from the substrate into the epitaxial structure. To further reduce this impurity migration, the substrate temperature was increased back to 600° C. and a 10 period superlattice 904 was grown utilizing 0.01 µm alternating layers of undoped GaAs and $Al_{0.3}Ga_{0.7}As$. This superlattice traps impurities at the $Al_{0.3}Ga_{0.7}As$:GaAs heterojunctions, preventing these impurities from diffusing into the active region of the device.

Next, a 0.2 µm layer 905 of $Al_{0.3}Ga_{0.7}As$ doped p-type with $N_A=5\times10^{18}$ was grown using a Be cell at a temperature of around 1000° C. This layer functions to confine minority carriers 906 to the hyperdoped GaAs region 908 that follows.

Over the next 0.05 µm, the substrate temperature was reduced to 500° C. and the Al cell was cooled, so as to form a compositionally graded layer 907 from $Al_{0.3}Ga_{0.7}As$ to pure GaAs. The Be cell temperature was also increased to about 1000° C., so as to dope the hyperdoped region to $9\times10^{19}$. Therefore, this region was graded in substrate temperature, doping and Al composition. This graded layer results in less surface recombination than an abrupt $Al_{0.3}Ga_{0.7}As$:GaAs heterojunction.

The next 1 µm layer is the actual hyperdoped GaAs region 908. This layer was grown at a substrate temperature of 500° C. with an As overpressure. Layer 908 was hyperdoped p-type to $9\times10^{19}$.

A graded layer 909 (similar to the graded layer 907) followed hyperdoped layer 908.

To produce layer 909, substrate temperature was increased to 600° C. and the Al cell temperature was increased over the next 0.05 µm, so as to grade the composition up to $Al_{0.3}Ga_{0.7}As$. This graded layer was followed by another of 0.2 µm layer 910 of p-type $Al_{0.3}Ga_{0.7}As$ doped with Be to $N_A=5\times10^{18}$, thus confining minority carriers to hyperdoped region 908.

Because hyperdoping permits the forcing of Be onto Ga sites in GaAs while keeping the density of non-radiative recombination centers low, it can be used to create materials with reduced radiative lifetime, without also letting non-radiative recombination channels dominate.

Hyperdoping can also be used to create materials with increased doping concentration at a given radiative lifetime, whether the radiative lifetime is longer or shorter. Or, hyperdoping can be used to create materials with higher probabilities of radiative vs. non-radiative recombination than the best prior art methods at any given high doping level.

Reducing the probability of non-radiative recombination enables the creation of more efficient LEDs and higher gain transistors. The performance of a number of important devices is controlled by the minority carrier lifetime—especially devices that employ gain media, electroluminescent media, a semiconductor pn, npn, or pnp tunnel junctions, diodes, or other multiterminal semiconductor devices. Notable examples of such devices include transistors, amplifiers, oscillators, demodulators, active filters, inverters, logic gates, limiters, threshold detectors, triggers, phase lockers, LEDs, lasers, VCSELs, semiconductor optical amplifiers, and wavelength converters. Hyperdoping of the base region (or its equivalent generalization) in such devices allows devices to be built that exhibit certain performance benefits compared to the prior art, among which may be one or more of the following: faster operation, faster electroluminescence speed, higher relaxation oscillation frequency, lower RC time constants, greater power efficiency, lower power losses, better heat sinking, higher contact efficiency, higher conductivity, lower operating voltages, lower threshold current, higher quantum efficiency, and/or higher gain. Hyperdoping can also offer better device-to-device reproducibility and simplified manufacturing.

In general, smaller semiconductor devices operate faster and cooler, so it is useful to eliminate effects which prevent scaling a device to smaller size. In particular, it is advantageous to reduce a material's contact resistance, bulk resistance, and interface resistance. Higher p-type doping, up to a critical concentration, usually lowers all three resistance components in a device. Lowering any resistance component is advantageous because it lowers the voltage drop, IR, and the Joule heating, $I^2R$: and therefore power loss, electromigration, temperature, accelerated aging, and other detrimental effects.

Several related points are well-known in the prior art, such as M. P. Patkar, T. P. Chin, J. M. Woodall, M. S. Lundstrom and M. R. Melloch, "Very Low Resistance Non-Alloyed Ohmic Contacts Using Low Temperature Molecular Beam Epitaxy of GaAs." *Appl. Phys. Lett.* 66, (1995) pp. 1412–1414. First, a thin (2–3 nm) surface region highly doped with Si, with the Si mostly on Ga sites, can be protected against oxidation by a thin layer of LTG GaAs, so a makes a good ohmic contact. Second, high Be doping during LTG leads to Be being on Ga sites both at the surface and in the bulk. However, the minority carrier lifetime in such prior art is dominated by non-radiative traps associated with the excess As that results from the use of LTG. No prior art anticipates or teaches hyperdoping in accordance with the teachings of this invention.

Nonobviously, hyperdoping presents several advantages for increasing a device's current handling capability or reducing its resistive losses. By enabling doping densities to be increased by up to an order of magnitude or more, the series resistance of a layer can be reduced by a similar factor. Likewise, contact resistance is generally reduced when contacting heavily doped layers. Since lower resistance results in lower Joule power dissipation ($I^2R$), these layers will exhibit lower losses and hence reduced heating. Similarly, the driving voltages can potentially be reduced, because voltage drops will also be reduced, and the operating frequency 3 dB limit $f=1/(2\times R\ C)$ can be higher if resistance R is lower. Alternatively, a given device may be operated at higher current densities, either by increasing the total current for a device with the same area, by decreasing the device area while maintaining a constant total current, or by a combination. Thus, the incorporation of hyperdoped layers in regions where power dissipation or voltage drop is significant enables advantageous tradeoffs among device area, current, current density, voltage, and power dissipation to be achieved.

Reference is now made to FIGS. 3A–C, which depict the creation of an ohmic contact by a prior art process. (As those ordinarily skilled in the art are aware, minimizing ohmic resistances becomes more important as devices are made smaller.) Traditionally, ohmic contact resistance is lowered by alloying the metal contact using localized crystal growth. This is done by affixing a metal 301 which contains a suitable dopant 302 (e.g., AuGe bearing Zn) adjacent to the semiconductor material 313 as in FIG. 3A, and heating the semiconductor to a temperature sufficient to liquefy both it and the metal in contact with it at their common interface 303. As depicted in FIG. 3B, the heated semiconductor and metal dissolve into one another around the interface, forming a molten region 306 of alloy 307 in a liquid phase, enriched by the dopant 302. The molten region 306 may encompass the entire thickness of some or all of 301, or the entire thickness of some or all of 313, both, or just some of the thickness (as depicted).

When the melt is cooled and the semiconductor recrystallized in 311 (see FIG. 3C), the concentration of the dopant is enhanced in 311 compared to 313. There may or may not be a clean or planar interface 312 between the old and recrystallized semiconductor. The recrystallized region of the metal 309 is usually dopant-poor because dopant has diffused into 311 from 309, but 309 is generally still highly conductive. There may or may not be a clean or planar interface between old and recrystallized metal at 308.

Unfortunately, this standard prior art approach is sensitive to a number of factors, including: variation in the temperature and thickness of the melt; non-planarities in the interface region (e.g., spiking of AuGe interfaces into GaAs) due to preferential dissolution along certain crystallographic planes, surface tension, or other effects; mechanical instability of the melt zone 306 during the heating process (including temperature ramping); variation in size of the alloyed region 311; and others. The interfaces at 308 and 312 may not be planar or parallel to the new metal-semiconductor interface 310. Interface 310 might be displaced from 303 and might not itself be planar. Most commonly in practice, surface tension will cause non-planar metal-semiconductor interfaces 310, thus preventing scaling to smaller lithographic feature sizes or smaller semiconductor devices.

Reference is now made to FIGS. 4A–4B, which depict an exemplary ohmic contact made using the inventive hyperdoping technique. As explained in more detail below, hyperdoping allows ohmic contact resistance to be lowered without requiring the use of alloys or alloying techniques. The higher doping that results from the hyperdoping method yields a higher space charge density, thus allowing a thinner space charge region to be built, which in turn produces a higher tunneling transmission coefficient (i.e., lower tunneling resistance). Such tunneling ohmic contacts have a number of advantages over traditional low barrier ohmic contacts. First, the space charge density and transmission coefficient of a tunneling ohmic contact does not exhibit significant temperature dependence. Second, certain material surfaces or interfaces pin Fermi levels within the energy gap, thus greatly complicating the use of low barrier contacts. In such materials, tunneling contacts are the most feasible ohmic contacts. Third, such ohmic metal-semiconductor tunneling interfaces can support high current densities. Fourth, high reflectivity can be obtained from a mirror-like planar, smooth metal-semiconductor interface formed without alloying. The fact that the invention can provide high quality contacts that also act as mirrors means that the performance of many optoelectronic devices, such as VCSELs and resonant cavity LEDs, can be dramatically improved. Use of mirrors on substrates which are transparent in the relevant wavelength is particularly advantageous.

In the prior art, the only ways to get a high concentration of dopant into the matrix resulted in a high concentration of dopant becoming interstitial. Even if the non-radiative traps associated with interstitial dopant are acceptable, the mere presence of interstitial dopant is disadvantageous since it compromises the long-term stability of the device, since the interstitial dopant can migrate under the influence of heat or an electric field. The hyperdoped semiconductor material in accordance with this invention avoids or mitigates this problem, since substantially all of the dopant atoms are located on anion or cation sites, and not interstitially within the crystal lattice.

FIG. 4A shows a region of bulk semiconductor 413 that has been hyperdoped, so as to form an ohmic junction where it meets metal contact 401 at an interface 403. In accordance with the invention, metal 401 does not require any doping, since it already forms an excellent ohmic contact with 413 without needing to be reheated. Semiconductor material 413 can be deposited by standard semiconductor industry equipment, such as machines for vapor deposition, vapor phase epitaxy, or molecular beam epitaxy, so long as an anion excess is used to hyperdope the material in accordance with the present invention. The contact material 401 (preferably metal) can be deposited in a number of ways, including conventional MBE growth, sputtering, plating, evaporation, or a variety of vapor phase or liquid phase methods. In some cases, it may be advantageous to remove any surface oxide on top of the hyperdoped semiconductor layer 413 to prevent an increase in the resistance of the contact due to the oxide.

The oxide may be removed by a number of techniques, including plasma cleaning or chemical etching just prior to metal deposition.

The approach of FIG. 4A is dramatically simpler, less variable, and less dependent on process wizardry than that of FIG. 3C. Although interface 403 can be molecularly flat or arbitrarily rougher, there is no need for recrystallization from an alloy in either case.

The flatness of the interface 403 can be exploited as a mirror (as shown in FIG. 4B). In one embodiment, the reflectivity of 403 will be as high as feasible, and light 420 produced on one side will reflect back as 421 to the same side. (Equivalently, light produced on the metal side can be made to stay on the metal side.) In another embodiment, an optional mirror material 425 (such as a Bragg reflector or metal mirror) will be used at 423, optionally across a second interface of material 413 or below other optional material 422 in order to form a resonant cavity between 403 and 423. Materials may be selected to permit light transmission and/or escape through the top, the bottom, the top and bottom, or neither, depending on both the relative and absolute reflectivities of mirrors 404 and 424. 404 generalizes the depiction of a mirror wherein 403 is an innermost face, and similarly 424 generalizes a mirror with innermost face 423. Such partially or completely reflecting surfaces 404 and 424 are useful for reflectors, mirrors, resonant cavities, and other devices, enabling lasers, RCLEDs, and other optoelectronic devices. In some cases, it may be advantageous for layer 401 to include a semiconducting layer at its interface with layer 413. If said semiconducting layer's dielectric properties can be matched to the reflective properties of the metal, the mirror reflected can be increased with said Bragg-like combination of dielectric and metallic reflectors.

Figure 4C:
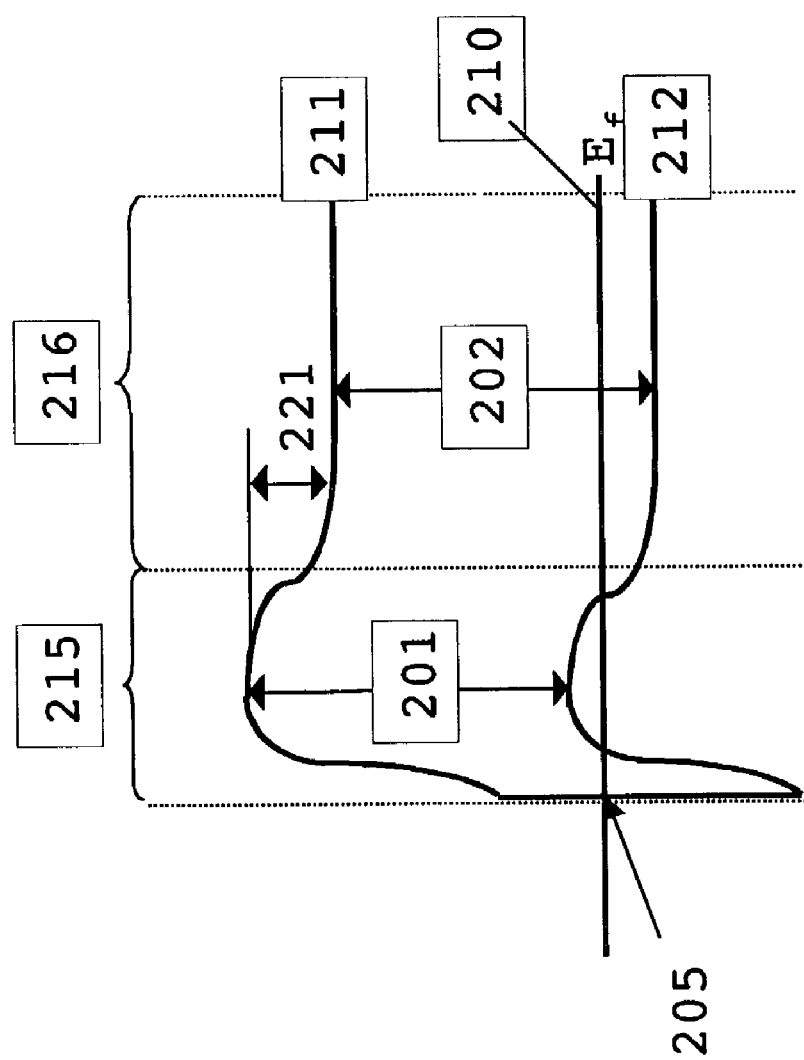
FIG. 4C illustrates a band diagram for a tunneling ohmic contact made in accordance with the invention.

Reference is now made to FIG. 4C. The use of hyperdoped material enables a surface passivation technique to be implemented in accordance with the invention, as a means of reducing the effective surface recombination velocity at bare semiconductor surfaces. It is well known that a bare GaAs surface exhibits a very high surface recombination velocity due to the high density of mid-gap states naturally occurring at a GaAs surface, hence high loss of minority carriers at this surface: a loss observed in the reduced performance of solar cells, photodetectors, and bipolar transistors, among other electronic and optoelectronic devices. Various means have been developed to reduce the effects of this surface recombination velocity, such as capping the surface with a heterojunction of AlGaAs to provide passivation. AlGaAs's band gap is wider than GaAs's, and so acts as a barrier to minority carrier current flow, preventing most of the minority carriers in the lower band gap GaAs from penetrating the AlGaAs and reaching the exposed surface.

Hyperdoped material enables an alternative, superior surface passivation technique to reduce the effective surface recombination rate. It is well known that variations in dopant density can be arranged to create an internal electrical field in a material, and that such a field can be used force carriers away from the heavily doped region into the lighter doped region. For example, a normally doped p-type region 216 of semiconductor with a band gap 202 lies beneath a hyperdoped p-type region 215 with a band gap 201. The surface 205 of the hyperdoped region 215 exhibits a high density of surface states which pins the Fermi level 210. The potential difference 221 created by the doping difference between regions 215 and 216 results in an internal electrical field which provides effective confinement of minority electrons in the conduction band 211. For the extremely high doping levels possible with hyperdoping, the surface states may become saturated, reducing the amount of Fermi level pinning 205, further reducing the surface recombination velocity. Furthermore, hyperdoping is capable of achieving strongly degenerately doped materials 215 such that the Fermi level 210 pushes into the valence band 212, creating an effective band gap widening effect. Those ordinarily skilled in the art can readily recognize that similar surface passivation effects can be achieved when using hyperdoping in n-type semiconductor materials. A strong enough field can confine minority carriers from a lightly doped region so that they penetrate only a limited, finite distance into a more heavily doped capping layer before returning to the lightly doped region. That is, the field can be used as a surface passivation corral. Unfortunately, this technique is problematic at higher doping densities, because band gap shrinkage reduces the effectiveness of the doping gradient, eliminating much of the benefit.

The prior art work by Harmon et al., *Appl. Phys. Left.*, 64, 502 (1994) showed that doping a semiconductor to a high enough doping density results in an effective band gap widening due to the effects of degeneracy. However, prior art materials with doping gradients as a surface passivation layer were less effective than hyperdoped material because the reduced minority carrier lifetime in prior art material resulted in an additional recombination component that negated much of the benefit of a doping gradient.

In contrast, use of hyperdoped material enables an improved tradeoff to be achieved, because a Be dopant density greater than $3\times10^{19}$ cm$^{-3}$ gives effective band gap widening which counteracts the band gap shrinkage, increasing the magnitude of the field repelling minority carriers from the surface. In addition, very highly doped material at the exposed surface can saturate or nearly saturate the surface states, reducing the surface band bending itself, and reducing the minority carriers' effective surface recombination velocity.

Figure 5:
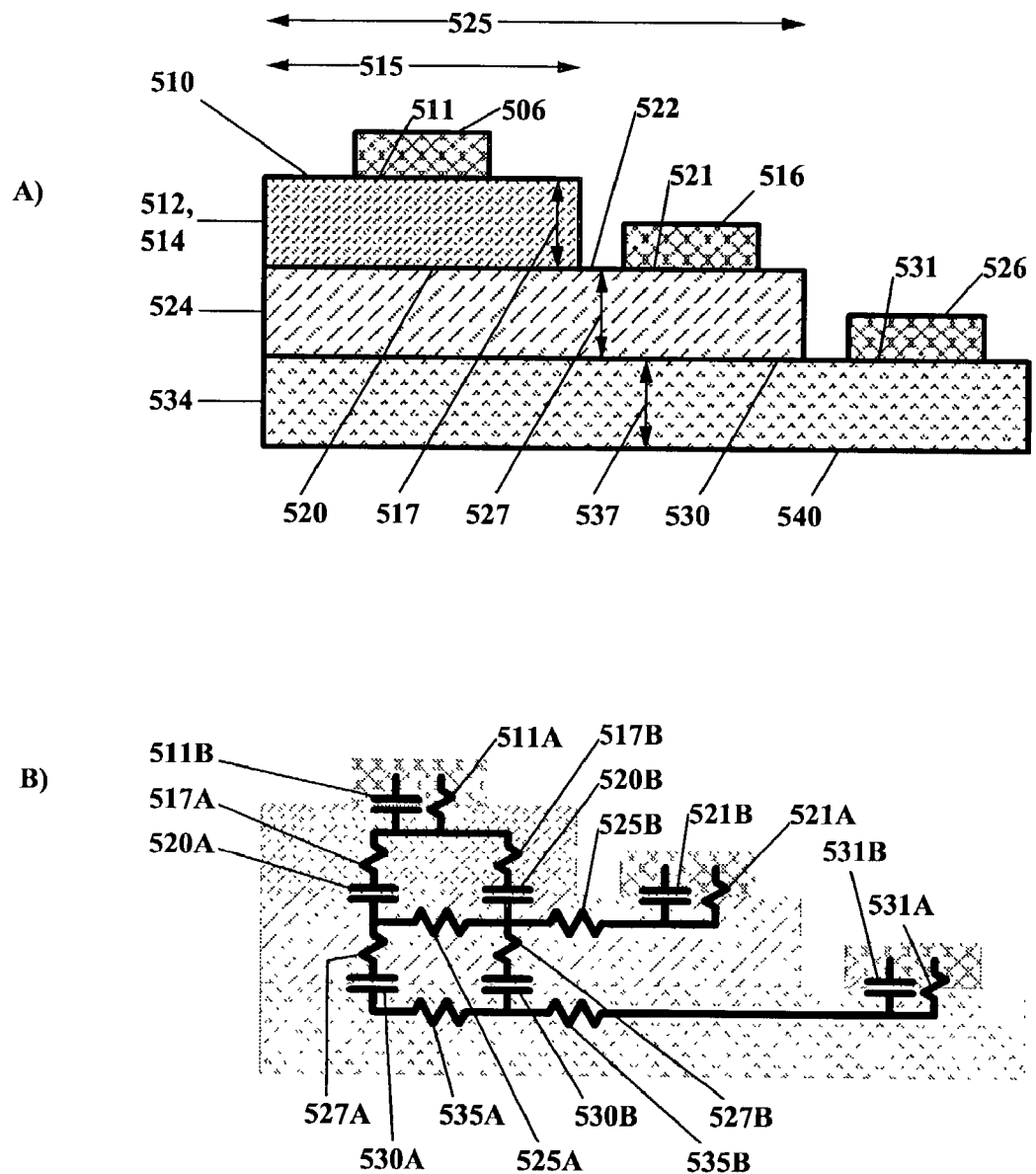
FIG. 5A shows a conceptual cross-section of a bipolar transistor made in accordance with the invention.
FIG. 5B is a simplified equivalent circuit model of the transistor parasitics depicted in FIG. 5A.

Reference is now made to FIGS. 5A–B, which illustrate the use of hyperdoping to reduce device bulk resistance(s) in a bipolar transistor. Since conductivity is linear to first order in the doping concentration and only slightly dependent on mobility (which tends to decrease with increasing doping level, but typically slowing only by a factor of 3 to 4 for a $10^4$-fold increase in doping), hyperdoping allows devices to be built with low bulk resistance. Low bulk resistance is important when thin layers of active devices, such as the base regions of transistors, need to be accessed.

FIG. 5A shows a conceptual cross-section of a bipolar transistor in accordance with the present invention. The dimension not shown (i.e., projected into the page) will ordinarily be rectangular or rounded, due to considerations of series inductance and limits of computer-assisted design (CAD) layout graphics. Emitter region 514 has an upper surface 510, a lower surface 520, and sidewalls 512. Metal contact 506 connects to emitter region 514 across an interface 511, ordinarily but not necessarily at 510. The lateral extent of the emitter region is a dimension depicted by 515. The so-called width or extent (often called WE in the literature) is represented by 517. Base region 524 has width 527 (denoted WB in the literature) and lateral extent 525. The base region's upper surface forms an interface with the lower surface of the emitter region at 520. A metal contact 516 connects to 524 across an interface 521, and 521 will typically be coplanar with 520. (Note that carriers can recombine non-radiatively at 512 and at the perimeter and extrinsic base region 522 where 520 does not provide an interface.) Collector region 534 has width 537. The collector region's upper surface forms an interface with the lower surface of the base region across an interface 530. A metal contact 526 connects to collector 534 across an interface 531. Interface 531 will typically be coplanar with interface 530. The collector's lower surface is annotated as 540. Metal contacts 506, 516, and 526 will ordinarily be connected electrically and mechanically to further wiring and circuitry, such as transmission lines. Such lines may overlay some of the aforementioned elements of the transistor, and may be separated by a dielectric or air bridge in order to minimize a path length or optimize electrical characteristics.

Hyperdoping enables the realization of heterojunction bipolar transistors (HBTs) and bipolar junction transistors (BJTs) with better performance than prior art techniques. In accordance with the invention, an HBT preferably includes a base region 524 formed from a thin region of hyperdoped semiconductor material, such as GaAs hyperdoped with Be to a concentration of $5\times10^{19}$ cm$^{-3}$ or higher. This hyperdoped material will have a lower resistivity, which in turn will yield a lower lateral resistivity (as modeled by distributed resistances 525A and 525B in FIG. 5B) across the base region.

A base region formed from hyperdoped material provides several significant advantages compared to base regions formed from prior art materials. Because hyperdoping forces most of the Be to occupy substitutional Ga sites, fast diffusion due to interstitial Be is suppressed. This results in more robust, stable devices that are not degraded due to temperature and current stressing. Furthermore, because hyperdoping provides very high quality material with long lifetimes, the HBT gain is less subject to the long-term degradation observed in prior art devices.

Hyperdoping a transistor's base region can also improve operating speed. As is well known in the art, the unity current gain cutoff frequency of a transistor (denoted $f_T$ in the literature) depends in part on the time it takes for minority charge carriers (e.g., electrons in an n-type base or holes in a p-type base) to transport across width 527. In general, a higher value of $f_T$ means a faster transistor. One way to increase the value of $f_T$ directly is by building a transistor with a thinner base region width 527. However, a thinner base width 527 has a greater lateral resistance along a direction transverse to 527, such as 525A along the direction indicated by 525. Increased lateral resistance adversely impacts a transistor's unity power gain cutoff frequency, $f_{max}$.

Use of hyperdoped materials permits a greater reduction in base region bulk resistance than is possible with prior art doping, resulting in a reduced lateral resistance in the base region and permitting WB to be made thinner without $f_{max}$ declining. Such tradeoffs were infeasible in the prior art, wherein heavy doping was used. As discussed previously, prior art heavy doping forms non-radiative recombination centers that result in significantly degraded minority carrier lifetimes. Such short minority carrier lifetimes significantly degrade the performance of HBTs by reducing the gain, β, and the base transport factor, α. In contrast, forming a base region from a hyperdoped material discourages the formation of fast non-radiative traps, as well as offering a reduced lateral base resistance and enabling thinner base widths to be utilized. $f_T$ or $f_{max}$ can thereby be increased to a higher speed with hyperdoped materials than with prior art materials, and speed can be traded back for improvements in other parameters such as those discussed below.

For a bipolar transistor, it is well known that the current $I_C$ from the emitter region 514 to the collector region 534 is controlled by the current $I_B$ from the emitter region 514 to the base region 524. Thus, current gain is typically defined as $\beta=I_C/I_B$. A direct way to improve β is to reduce the width 527 of the base region 524 between the interfaces 520 and 530. Using hyperdoped material in the base region permits better tradeoffs to be made between β and $f_{max}$, such as raising β without lowering $f_{max}$. More generally, using hyperdoped materials permits more optimal tradeoffs to be made among the performance factors $f_T$, $f_{max}$, feature size, breakdown voltage, α and β. For instance, all six could be improved together, or one could be improved without deleterious effects on the others, or a plurality could be deoptimized while others are optimized. For example, the cycle time of a digital circuit can be optimized by minimizing the resistance of the base while preserving microwave performance. Equivalently, a transistor structure can be implemented in hyperdoped material which meets a particular microwave performance goal, yet has superior digital performance than an analogously optimized transistor formed from only prior art materials.

An additional method for improving the performance of transistor structures is to grade the base doping profile. It is well known in the literature that grading the base doping— by decreasing the doping density as a function of position across the base width 527, with the heaviest doping near the emitter-base junction 520, and with the doping decreasing to a lower doping value near the base-collector junction 530—is very effective in reducing the base transit time. Such doping gradient produces an internal electric field that accelerates minority carriers away from the emitter-base junction 520 and toward the base-collector junction 530. It is also well known that band gap shrinkage due to heavy doping acts to reduce the effectiveness of graded-base doping and reduces the performance of graded base transistors. Hyperdoping enables an improved tradeoff to be achieved because doping a semiconductor such as GaAs to doping densities greater than $3\times10^{19}$ cm$^{-3}$ results in an effective band gap widening due to the effects of degeneracy (see Harmon et al., *Appl. Phys. Lett.*, 64, 502 (1994)). Furthermore, degenerate doping appears to enhance the minority carrier diffusivity (Harmon et al., *Appl. Phys. Lett.*, 63, 536 (1993)), resulting in further enhancement of the base transit time. Therefore, utilizing the invention to grade the base doping from $1\times10^{20}$ cm$^{-3}$ down to a level between 1 and $5\times10^{19}$ cm$^{-3}$, for example, promises better base transit times than prior art graded base doping, where the variation was from about $5\times10^{19}$ cm$^{-3}$ or less down to $1\times10^{19}$ cm$^{-3}$ or less. In addition, the higher doping the invention provides at the emitter edge results in a reduction of base contact resistance, while the reduced doping at the collector edge results in an improvement in the base-collector breakdown voltage. As is well known in the field, quasi-electric fields can be built into the base by varying the semiconductor alloy composition such that there is a wider band gap at the base-emitter junction when compared with the band gap at the base-collector junction. Such alloy compositional grading can be used in combination with hyperdoped base grading to achieve further performance improvement.

A further objective of graded base doping is to sweep minority carriers away from the surface of the extrinsic base region 522, which is often a primary site of recombination. Recombination at the extrinsic base region produces an increase in $I_B$ without an associated increase in $I_C$, thus reducing the current gain β. Hyperdoping can reduce losses from recombination at the extrinsic base surface in several ways. First, a graded hyperdoped base creates an internal electrical field (greater that realizable without hyperdoping) which sweeps electrons away from the extrinsic base region and thereby reduces or eliminates recombination at the extrinsic base surface. Second, as described above in reference to surface passivation techniques, hyperdoping may be used to saturate the surface states at the extrinsic base surface, which reduces surface band bending and surface recombination velocity.

Hyperdoping also enables optimization of other parameters. Important considerations in RF power amplifiers include power efficiency and third-order intermodulation (IM3) distortion. Investigators have found that power efficiency of class E power amplifiers is improved by reducing the collector current fall time, which in turn is improved by increasing $f_T$ and $f_{max}$ (see J. S. Yuan, *SiGe, GaAs, and InP Heterojunction Bipolar Transistors*, John Wiley, (1999)). Others have explored the effects of physical device parameters on IM3, and found IM3 to be very sensitive to the capacitance of the junction between the emitter and its contact ($C_{JE}$), but insensitive to forward time, base resistance, and current gain (see S. A. Maas, B. L. Nelson, and D. L. Tait, "Intermodulation in heterojunction bipolar transistors." *IEEE Trans. Microwave Theory Tech.*, MMM-40, 442, (1992)). Use of hyperdoped materials permits structures to have higher $C_{JE}$, hence lower IM3, while making less significant compromises on other important parameters, especially $f_T$ and $f_{max}$. Another group has observed that linearity is optimized at a low (but not necessarily lowest) value of $R_b$ (see Vuolevi et al., The Effects of Source Impedance on the Linearity of BJT Common-Emitter amplifiers. ISCAS '2000). Hyperdoping permits greater latitude in optimization of $R_b$, such as by adding resistance externally. Accordingly, hyperdoped materials can also be used to provide improved linearity for an overall device, over a broader range of frequency and power. For instance, reducing voltage drop across the base region reduces the dependence of current gain β on collector current $I_C$, which is especially important at high current levels. Another well known problem in the art is the reduction of current gain and cutoff frequency as a result of self-heating and other effects related to high current levels (see J. J. Liou, *Principles and Analysis of AlGaAs/GaAs Heterojunction Bipolar Transistors*. Artech House, 1996). Devices formed with hyperdoped materials can exhibit substantially lower internal resistance, which reduces self-heating and its effects.

Reference is once again made to FIG. 5B, which shows a simplified equivalent circuit model of a bipolar transistor. In FIG. 5B, the contact resistance and capacitance across the interface 511 are represented schematically by resistor 511A and capacitor 511B, respectively, and similarly for contact resistance 521A and capacitance 521B across interface 521, and contact resistance 531A and capacitance 531B across interface 531. The bulk resistance integrated across the width of the emitter region is shown distributed as resistors 517A and 517B. Similarly, the bulk resistance integrated across the width of the base region is shown distributed as resistors 527A and 527B. The bulk capacitance across the emitter-base junction is shown distributed as capacitors 520A and 520B. Likewise, the bulk capacitance across the base-collector junction is shown distributed as capacitors 521A and 521B. The lateral resistance along the base region is shown distributed as resistors 525A and 525B, and the lateral resistance along the collector region is shown distributed as resistors 535A and 535B.

One way to improve the operating frequency of transistors and related devices is to use hyperdoped materials in the base or base-like region as discussed above. Another way is to reduce the lithographically defined emitter lateral extent 515. Several factors make narrower emitters more expensive than using hyperdoping, even when both are used together. First, the RC nature of the equivalent distributed circuit model of the base region indicates that current will tend to crowd toward the edges of the base region at both low and high frequencies. The well-known AC current crowding effect explains (at least in part) the reduction in power gain observed as a function of frequency. Traditionally, this problem has been addressed by lithographically reducing the emitter lateral extent 515, the finer the more expensive. The availability of hyperdoped materials allow reduction of lateral resistance in the base region (e.g., resistors 525A, 525B, etc.) without reducing 515, thereby permitting an emitter of greater lateral extent to be used with less DC and AC current crowding than would otherwise be feasible, or producing less current crowding from an emitter of the same lateral extent, and so forth in combination. Second, careful high order device modeling shows that $f_{max}$ increases with smaller lateral extent 515, so transistor designers typically make the lateral extent 515 of an emitter as small as permitted by a given (i.e. affordable) lithographic process anyway. This means that the lateral extent 515 will ordinarily already be minimized and not practical for trading off against conductance. Using hyperdoped materials offers improved tradeoffs among the lateral extent 515 of the emitter, lateral base resistance 525A and 525B, and things dependent on them as well. Though operating frequency can be increased by reducing the lithographically defined emitter width, it can be increased more cost-effectively by first (or only) using hyperdoped material in the base region to permit a higher $f_{max}$ without having to decrease lithographic feature size.

Hyperdoped material can also be used to reduce the contact resistance 521A across the interface 521 between 516 and 524. Such reduced contact resistance will enable reduced emitter and collector charging times. Additionally, hyperdoping may be used to reduce the extrinsic resistance of the collector and emitter, further reducing the emitter and collector charging times $\tau_E$ and $\tau_C$ respectively. Reduction in $\tau_E$ and $\tau_C$ will also result in a higher $f_T$ and $f_{max}$ operation.

As those ordinarily skilled in the art will appreciate, applications of hyperdoping are by no means limited to base regions, ohmic contacts, or even transistors. Rather, hyperdoped materials can be used for any region in a wide variety of semiconductor devices. Hyperdoped materials offer reduced contact resistance, reduced bulk resistance, longer non-radiative lifetimes, longer or shorter radiative carrier lifetime, and numerous other benefits that follow from these, as taught above in connection with the discussion of base regions. The discussion below (which is not, and is not intended to be, exhaustive) exemplifies the application of hyperdoping to the design and fabrication of devices other than homojunction and heterojunction transistors.

Figure 6A:
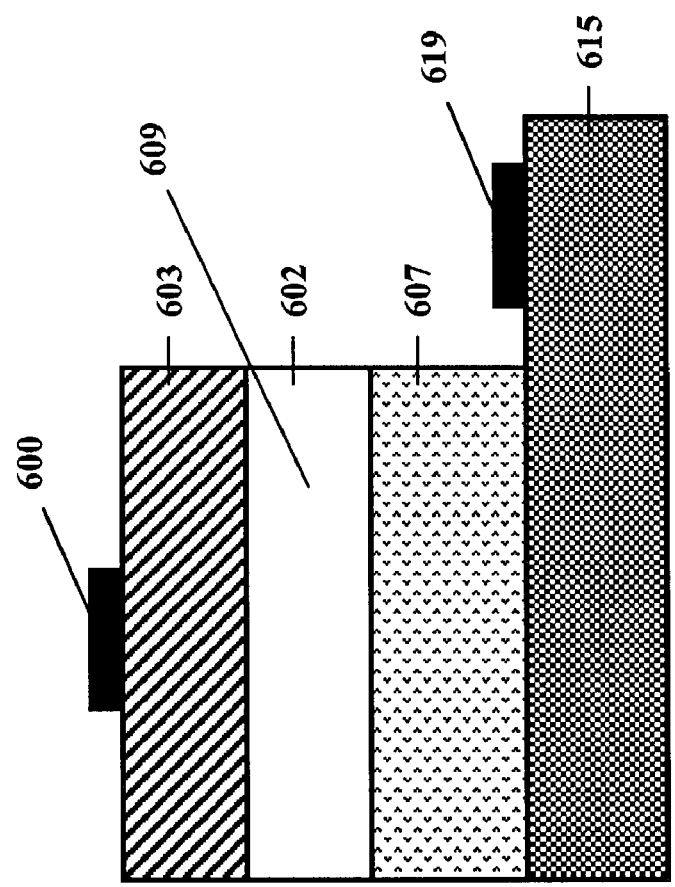
FIG. 6A shows a double heterojunction light-emitting diode made in accordance with the invention.
Figure 6B:
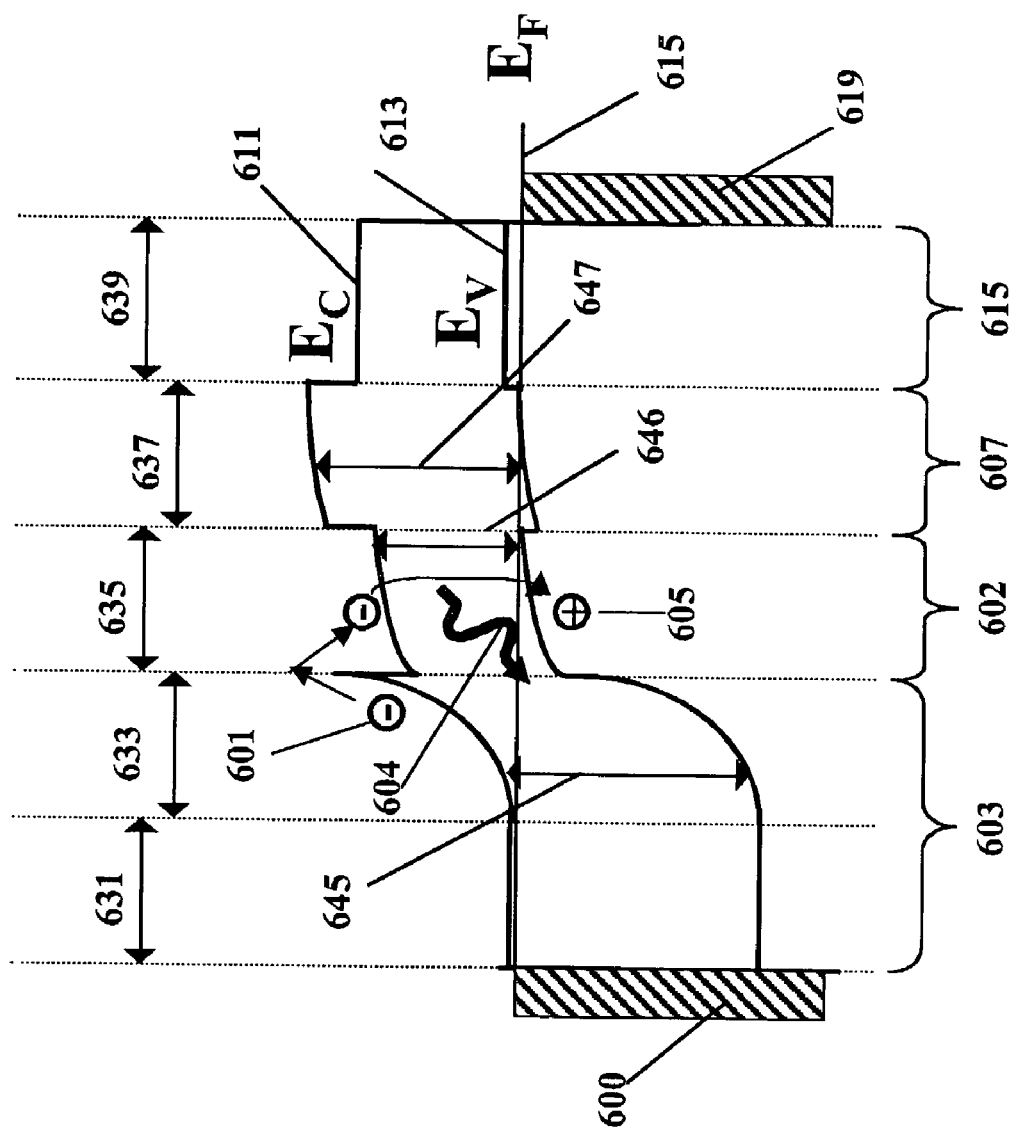
FIG. 6B illustrates the band diagram for the device depicted in FIG. 6A.

Reference is now made to FIGS. 6A & 6B, which shows a double heterojunction light-emitting diode made in accordance with the invention. Prior art describes the function of double heterostructure light-emitting diodes (DHLEDs). Minority carriers 601 are injected into an active region 602 from an emitter region 603 contacted by 600. To insure that the minority carrier injection is primarily in the direction from region 603 to region 602, the band gap 645 of region 603 is typically at least several times $k_B T$ larger than the band gap 646 of region 602. These carriers 601 generate photons 604 upon recombination with majority carriers 605 in the active region 602 of the semiconductor material 601. The photon energy is approximately equal to the energy band gap 646 of the active region 602. A confining region 607 of a wider band gap semiconductor 647 is typically used as a barrier to help localize minority carriers in active region 602. The time it takes the minority carriers to recombine is, on average, the minority carrier lifetime 609 of the semiconductor material in 601 used in active region 602.

The band diagram of the DHLED is shown in FIG. 6B. The conduction band edge is represented by 611, the valence band edge by 613, and the Fermi level by 615. The emitter 603 can be divided into a depletion region of thickness 633 and a neutral contacting layer of thickness 631. The active layer 602 has a thickness 635, the confining region 607 has a thickness 639, and the back contact 615 has a thickness 639. A metal contact 619 makes an ohmic contact to the back contact layer 615.

The maximum frequency at which a DHLED can be efficiently modulated is typically calculated, using a small signal model, as $1/(2\pi\tau)$, where $\tau$ is the minority carrier lifetime 609 in the active region. As is well known, minority carrier lifetime is comprised of a radiative component and a non-radiative component. The radiative component is approximately inversely proportional to the majority carrier concentration, while the non-radiative component can be associated with the density of defects (defect recombination), as well as inversely proportional to higher orders of this concentration (Auger recombination). Therefore, by doping the active region 602 more heavily, the minority carrier lifetime 609 is decreased and the modulation bandwidth is increased. As previously noted, however, traditional growth techniques generated excessive non-radiative traps as doping levels increase. At high doping levels (using prior art techniques), these non-radiative traps typically dominated minority carrier lifetime and ruined efficiency.

Hyperdoping avoids such non-radiative trap formation. With reference to FIGS. 6A & 6B, employing hyperdoping in the active region 602 of a DHLED will increase the DHLED's upper modulation bandwidth limit by decreasing the minority carrier radiative recombination lifetime in the active region without introducing non-radiative traps. Previously, high speed DHLEDs relied on the fast traps to quench the electroluminescence, sacrificing efficiency for speed. Hyperdoped DHLEDs, on the other hand, have a fast radiative recombination component sustaining high optical efficiency at high speeds. Therefore, at the same operating frequency, hyperdoped DHLEDs will be much brighter than traditionally high-doped, high-speed DHLEDs. Hyperdoping also can benefit the DHLED by decreasing the contact resistance between metal contact 619 and the hyperdoped p-type semiconductor contact region 615, as well as reducing the contact resistance between the top contact 600 and the emitter 603. Furthermore hyperdoping layers 603 and 615 lowers the spreading resistance of the LED, lowering current crowding effects which tend to confine the majority of the current in such devices to volumes closest to the contacts, resulting in more uniform current flow throughout the device, and hence more uniform light output.

Hyperdoping may also be used to improve the ratio of radiative to non-radiative recombination, thereby making it possible to increase the radiative efficiency of non-ideal semiconductor materials. While many high-quality semiconductors used in LEDs, lasers, and other optoelectronic devices exhibit good radiative efficiency a low doping levels (non-hyperdoped), certain materials exhibit poor radiative recombination efficiency due to the presence of a high background level of non-radiative defects such as impurities, point defects, dislocations, grain boundaries, and surface states. Examples of such materials include semiconductors with high levels of background impurities, polycrystalline semiconductors, semiconductors with high densities of dislocations such as those grown on lattice mismatched substrates using techniques as metamorphic growth, compliant substrates, or compliant interface layers between dissimilar epilayers and substrates, and thin semiconductor layers with high surface recombination velocities. It is notably difficult to produce LEDs, lasers, and other optoelectronic devices in such materials. Hyperdoping can be used to significantly improve the ratio of radiative to non-radiative recombination in such materials and thereby result in the creation of useful optoelectronic devices.

A generalization of this reveals that hyperdoping allows a material to be created with its radiative lifetime and non-radiative lifetime independently specified (within limits). Prior art materials generally could not be created this way for radiative lifetimes shorter than something like a few hundred ps.

Figure 7:
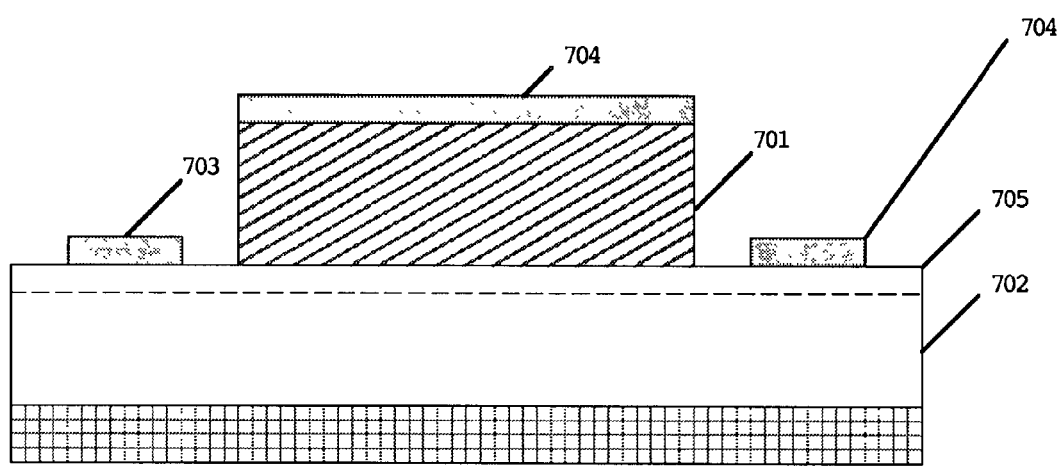
FIG. 7 shows a field effect transistor made in accordance with the invention; and, FIGS. 8A–B show exemplary high electron mobility transistors made in accordance with the invention.

Reference is now made to FIG. 7, which depicts a heterojunction field effect transistor (HFET) made in accordance with the invention. As mentioned earlier, hyperdoped HFET devices can be designed to operate faster, cooler, and/or at lower turn-on voltage than otherwise equivalent prior art HFETs designed without hyperdoped materials. An HFET operates by controlling the current flow along a heterojunction channel between a wide band gap semiconductor 701 and narrow band gap semiconductor 702. In the On condition, the HFET operates in accumulation mode, as current flows between the source 703 and drain 704 contacts through the hyperdoped n-channel 705. The HFET is turned Off when a voltage is applied between gate contact 704 and source 703, depleting the n-channel 705 and shutting off the current flowing between the source 704 and drain 704.

In accordance with the invention, use of hyperdoped material in channel 705 decreases the on-resistance of the channel $r_{ds}$, and thus increases the transconductance $g_m$, unity gain frequency $f_T$, and similarly $f_{max}$. Additionally, the reduction in contact resistance at source 703 and drain 704 supports reduced output resistance, enabling higher gain and frequency response to be realized.

Although reducing IR loss is important, engineers have found other ways to engineer around them. This invention reopens the optimization of those tradeoffs. To first order, the drive current between source and drain through a transistor equals the conductivity times the electric potential drop, hence is almost directly proportional to the doping. An idealized field effect transistor modulates current flow from source to drain through the channel under the gate, while keeping resistance elsewhere as low as possible. Higher carrier concentration limits because of hyperdoped materials enables more nearly ideal transistors. The less-optimized finite source resistance of a transistor resulting from low doping only allows a lower extrinsic gain. If the source is considered grounded, for notational convenience, then the prior art only allows a lower potential drop across the intrinsic part of the transistor (e.g., the junction under the gate), so the prior art transistor gain is commensurately less than the gain in transistors in accordance with the invention.

Figure 8A:
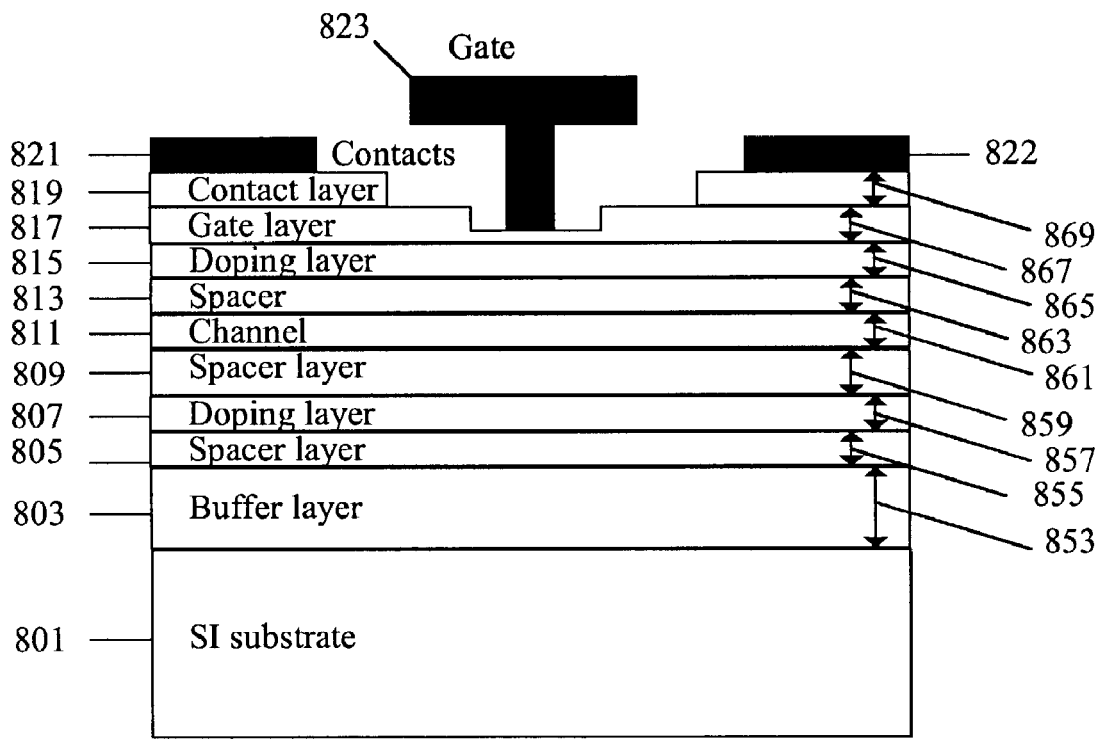

Reference is now made to FIG. 8A, which depicts an exemplary high electron mobility transistor (HEMT). Hyperdoping allows significant performance enhancements to be achieved for field effect transistors, such as the modulation doped field effect transistor (MODFET), also called a HEMT. The general MODFET structure is comprised of a sequence of semiconductor layers on a substrate 801. Common substrate materials include wafers of Si, GaAs, InP, and other materials available from semiconductor supply houses, notably semi-insulating GaAs. An optional buffer layer 803 (such as crystalline GaAs) with thickness 853 is advantageously located on top of the substrate 801, if needed to ensure a clean, nearly monocrystalline template for further growth. In some designs, all of the semiconductor layers are lattice matched to buffer layer 803. A first optional spacer layer 805 of thickness 855 is located above 803, if present. A typical spacer material is $Al_xGa_{1-x}As$, with x typically a constant in the range of 25–35%, but also may be a variable Al mole fraction as a function of thickness of the layer. If wafer bonding is used, layers 803, 805, 807, 809, 811, 813, 817, 819, and 821 may be grown on a different substrate and transferred to substrate 801 via the bonding process, enabling the lattice constant of these layers to be independent of the substrate's. Another alternative includes metamorphic growth of layer 803, whereby graded growth techniques enable the lattice constant of layer 803 to be gradually varied from the substrate 801 lattice constant to a lattice constant compatible with the spacer layer 805 without introducing significant crystalline defects into spacer layer 805. A third alternative is to use techniques such as epitaxial lateral overgrowth (ELO) to grow high quality epilayers that do not necessarily match the lattice of substrate 801. A fourth alternative is to use a superstrate technologies whereby very high quality compound semiconductor layers are grown on lattice mismatched substrates, usually by the incorporation of some sort of compliant interface layer that is capable of providing good adhesion to the substrate while simultaneously providing a good lattice template match to the superstrate. For example, such superstrate technology may enable high quality epilayers of GaAs to be grown on silicon substrates, enabling very large area superstrates to be achieved, and facilitating monolithic integration with silicon circuitry.

An optional first doping layer 807 has a thickness 857, which may be as thin as a single monolayer of semiconductor in devices using delta doping. A second optional spacer layer 809, with thickness 859, is located above 807. A channel region 811 of thickness 861 is located above 809. In order to minimize resistance due to scattering of carriers within the channel, the material forming the channel region is ordinarily undoped and has a high carrier mobility. Devices operate with better performance if the channel material also has a pseudomorphic composition, where strain induced into the channel crystal results in advantageous band offsets and enhanced mobilities. A third optional spacer layer 813 of thickness 863 separates the channel from an optional second doping layer 815 of thickness 865, thickness 865 being as thin as a monolayer in a delta doped device. A gate layer 817 of thickness 867 is on top of the doping layer. A contact layer 819 of a thickness 869 is on top of gate layer 817.

Individual MODFET designs may have other layers, but the details of such layers—including their presence, absence, or ordering—are not critical for an understanding of how the present invention improves the design or fabrication of MODFETs. Basically, all MODFET designs include a channel 811, at least one doping layer 815 (or 807) and a gate layer 817. Each layer usually differs from other layers in some semiconductor material property, such as band gap, doping, electron affinity, lattice constant, or some combination of these parameters. Within each layer, these parameters may be varied as a function of position within the device.

In one exemplary variation of the MODFET, the channel 811 is comprised of a pseudomorphic semiconductor region that exhibits a strained lattice compared to the surrounding semiconductor. A MODFET including pseudomorphic regions is usually called a pseudomorphic high electron mobility transistors (pHEMT).

MODFETs are fabricated by etching through the contact layer 819 and into the gate layer 817. Gate 823 is deposited on top of the gate layer. Contacts 821 and 822 are deposited on contact layer 819 and are conventionally alloyed to make low resistance ohmic contacts to the channel 811, by alloying through the contact layer 819, gate layer 817, doping layer 815, and spacer layer 813. In standard field effect transistor terminology, one contact 821 is called the source and the other contact 822 is called the drain. A voltage applied to the gate is used to modulate the conductivity of the channel and hence the output characteristics of the MODFET. Current in the channel is proportional to the product of electron mobility, carrier density, and the applied electric field across the source 821 and drain 822 contacts. The carrier density can be equilibrated to some fraction of the neighboring doped region(s) 815 and 807, which means that if a channel 811 has a thickness 861 of 100 nm, and neighboring regions 815 and 807 are hyperdoped to $10^{20}$ $cm^{-3}$ p-type dopants, the channel will be loaded with up to $10^{+15}$ $cm^{-2}$ carriers. MODFET device designs advantageously use optional spacer layers 809 and 813 to separate the doping layers 807 and 815 from the channel 811 in order to reduce scattering of free carriers in the channel from the dopants localized to layers 807 and 815. MODFETs are capable of achieving both high carrier concentrations and high carrier mobilities at the same time, hence beneficial high performance transistor characteristics.

Figure 8B:
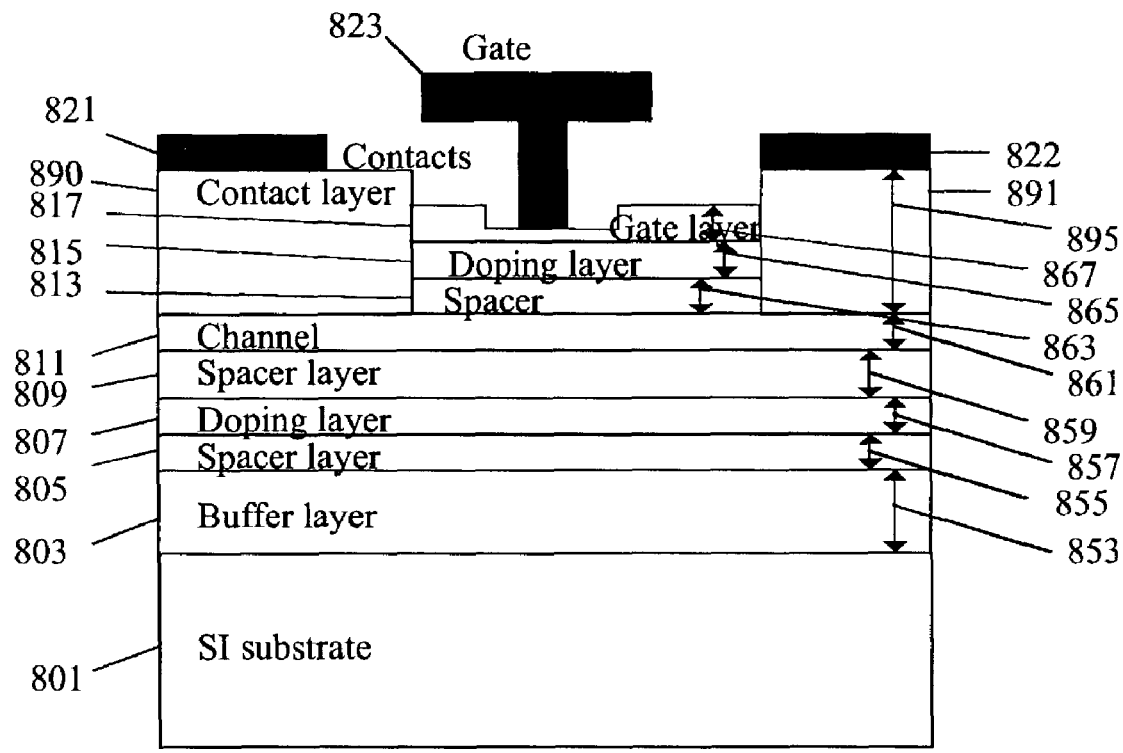

Referring now to FIG. 8B, one exemplary MODFET design achieves improved performance by exploiting low resistance in contact layer 819. One innovative technique to make very low contact resistances for the source 821 and drain 822 contacts involves etching through gate layer 817, doping layer 815 and spacer layer 813 to enable direct contact to the channel layer to be achieved without the additional resistance caused by layers 813, 815, 817, and 819. The source and drain contacting regions are regrown using the hyperdoping techniques of the invention. The layers in FIG. 8B are identical to those shown in FIG. 8A, except for source region 890 and the drain region 891, both of which have been regrown and are of a thickness 895. Using hyperdoping to achieve regrowth of highly doped materials in these regions enables extremely low resistance source and drain contacts to be achieved. Further, the moderate substrate temperature during the hyperdoping technique contributes less damage to the active regions of the device, resulting in superior performance.

A second example of a MODFET enabled by hyperdoping exploits increased doping density in doping layers 807 and 815. This enables higher charge densities to be achieved in the channel, depending on the material properties of layers 807, 809, 811, 813, 815, and 817, including band gap and electron affinity. In general, all these layers (except 811) have a wider band gap and lower electron affinity than channel 811. The conduction band offsets between layers 813 and 811, as well as the offsets between layers 809 and 811, form a quantum well, which traps the free electrons generated by the doping layers 815 and 807. For devices in which the well is sufficiently deep to trap more charge than conventionally doped materials can provide, hyperdoping enables a higher density of electrons to be transferred to the well, resulting in significant performance improvements for n-channel MODFETs. Furthermore, hyperdoping techniques also produce superior crystal quality and lower diffusion of dopants during anneals and elevated temperature operation, resulting in improved device performance.

Without loss of generality, similar results can be achieved for p-type doping where layers 807, 809, 811, 813, 815, and 817 have a wider band gap and a higher electron affinity when compared with the channel 811. The valence band offsets between layers 813 and 811, as well as the offsets between layers 809 and 811, form a quantum well that traps the free holes generated by doping layers 815 and 807. For the devices in which the well is sufficiently deep to trap more charge than current material can produce, hyperdoping enables a higher density of holes to be transferred to the well, similarly resulting in significantly improved performance for p-channel MODFET devices. In general, p-channel MODFETs and n-channel MODFETs may be advantageously combined in complementary transistor circuits to obtain improved circuit performance and greater efficiency.

The invention can allow certain FETs to be designed for higher frequency operation under specialized circumstances, due to several subtle factors working together. The increased doping concentration offered by the invention allows materials to be created with increased sheet carrier concentration, $n_s$, of the 2D electron gas. Higher $n_s$ reduces Coulombic scattering, SO increases carrier mobility. Transconductance, $g_m$, also increases with $n_s$. So, $f_T$ can also be increased, since it is approximately proportional to $g_m/C_{gs}$, where $C_{gs}$ is the gate source capacitance. Indeed, since the maximum available gain increases with $f_T$, higher $n_s$ can be exploited to extract higher current gain at any given frequency. Those ordinarily skilled in the art will recognize that $C_{gs}$ increases with increased doping, but will usually be held constant by design trade-offs to maintain a given pinch-off voltage, (e.g., by thinning the AlGaAs layer). Along with decreased parasitic source & drain resistances and other benefits, these improved parameters can be exploited severally or in combination to enable the design, construction, and/or use of superior electronic devices, circuits, and systems of them.

Hyperdoped HEMTs are particularly advantageous for logic applications. Because of the need to preserve a specified pinch-off voltage, hyperdoping typically produces high-gm, high-$C_{gs}$ devices. Such devices are relatively insensitive to parasitic interconnect capacitance, and thus can operate faster. In addition, hyperdoping permits shorter gate lengths without compromising pinch-off voltage, thus permitting higher speed operation.

As those ordinarily skilled in the art will appreciate, a significant effort has been made to provide much more than just process recipes in this disclosure. Instead, with the hope of facilitating a complete appreciation of the full scope the invention and the numerous applications of the hyperdoping, the inventors have attempted to explain the underlying physics in detail. The reader should understand, however, that hyperdoping is a new technique, and there exists a possibility that certain of the inventors' theories of operation may not be 100% correct. It is important to note that errors or gaps in the understanding of how or why an invention works do not undermine the validity of a patent. See Newman v. Quigg, 720 F.2d 1565, 1570 (Fed. Cir. 1983) ("[I]t is axiomatic that an inventor need not comprehend the scientific principles on which the practical effectiveness of his invention rests.").

Furthermore, notice is hereby given that the applicants intend to seek, and ultimately receive, claims to all aspects, features and applications of the current invention, both through the present application and through continuing applications, as permitted by 35 U.S.C. §120, etc. Accordingly, no inference should be drawn that applicants have surrendered, or intend to surrender, any potentially patentable subject matter disclosed in this application, but not presently claimed. In this regard, potential infringers should specifically understand that applicants may have one or more additional applications pending, that such additional applications may contain similar, different, narrower or broader claims, and that one or more of such additional applications may be designated as not for publication prior to grant.

What we claim in this application is:

1. A method for producing a hyperdoped semiconductor material using an epitaxial growth process, comprising operating a growth chamber at a substrate temperature of 300 to 500° C. while providing at least one anion, at least one cation and a selected dopant, and while maintaining a partial pressure for oxygen atoms, radicals, molecules and oxygen-containing or bearing compounds and materials of less than $10^{-9}$ torr.

2. A method for producing a hyperdoped compound semiconductor material, comprising introducing dopant atoms into a compound semiconductor material at a concentration greater than the bulk carrier saturation limit of the dopant in the semiconductor material, said semiconductor material comprised of at least one cation element and at least one anion element such that in the resulting hyperdoped semiconductor material there is an excess of anion atoms, substantially all of the dopant atoms are located on cation substitutional sites, and minority carrier recombination is dominated by radiative recombination.

3. A method as in claim 2, wherein the step of introducing comprises operating a growth chamber at a moderate substrate temperature while providing the anion atoms, cation atoms and the dopant atoms, and while maintaining a low background pressure for oxygen atoms, radicals, molecules and oxygen-containing or bearing compounds.

4. A method as in claim 2, wherein the step of introducing comprises implanting into the compound semiconductor material the dopant atoms, and further comprising performing a thermal anneal.

* * * * *